US012796295B2

(12) United States Patent
Byun et al.

(10) Patent No.: US 12,796,295 B2
(45) Date of Patent: Nov. 10, 2026

(54) DISPLAY DEVICE AND METHOD OF MANUFACTURING THE SAME

(71) Applicant: Samsung Display Co., LTD., Yongin-si (KR)

(72) Inventors: Jin-Su Byun, Yongin-si (KR); Woongsik Kim, Yongin-si (KR); Donghwan Bae, Yongin-si (KR); Jeongseok Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 374 days.

(21) Appl. No.: 18/426,823

(22) Filed: Jan. 30, 2024

(65) Prior Publication Data

US 2024/0373727 A1 Nov. 7, 2024

(30) Foreign Application Priority Data

May 4, 2023 (KR) ........................ 10-2023-0058641

(51) Int. Cl.

| | |
|---|---|
| ***H10K 59/80*** | (2023.01) |
| ***H10K 59/12*** | (2023.01) |
| ***H10K 59/122*** | (2023.01) |
| ***H10K 59/131*** | (2023.01) |
| ***H10K 59/88*** | (2023.01) |
| ***H10K 71/20*** | (2023.01) |
| ***H10K 71/60*** | (2023.01) |

(52) U.S. Cl.

CPC ....... *H10K 59/879* (2023.02); *H10K 59/1201* (2023.02); *H10K 59/122* (2023.02); *H10K 59/131* (2023.02); *H10K 59/873* (2023.02); *H10K 59/88* (2023.02); *H10K 71/231* (2023.02); *H10K 71/60* (2023.02)

(58) Field of Classification Search

CPC .. H10K 59/879; H10K 59/122; H10K 59/131; H10K 71/60; H10K 59/88; H10K 59/873; H10K 71/231; H10K 59/124; H10K 59/872; H10K 59/1201; H10K 59/80521; H10K 59/8731

See application file for complete search history.

(56) References Cited

U.S. PATENT DOCUMENTS

2017/0162640 A1* 6/2017 Lee ...................... H10D 30/673
2021/0083219 A1* 3/2021 Zhang .................. G09G 3/3258

(Continued)

FOREIGN PATENT DOCUMENTS

KR 101801913 B1 11/2017
KR 102068848 B1 1/2020

*Primary Examiner* — Yasser A Abdelaziez

(74) *Attorney, Agent, or Firm* — CANTOR COLBURN LLP

(57) ABSTRACT

A display device includes a substrate, a first pixel electrode a pixel defining structure including an inorganic protective layer, a first metal layer disposed on the inorganic protective layer, and a second metal layer disposed on the first metal layer and defining a first pixel opening including a first undercut structure, a first organic light emitting layer disposed on the first pixel electrode in the first pixel opening, a first common electrode layer disposed on the first organic light emitting layer in the first pixel opening, a first stack layer, a first capping layer, and a first light extraction structure which fills the first pixel opening covered by the first capping layer has a convex upper surface over the first pixel opening.

7 Claims, 25 Drawing Sheets

(56) References Cited

U.S. PATENT DOCUMENTS

| | | | | |
|---|---|---|---|---|
| 2022/0399411 | A1* | 12/2022 | Li | H10K 59/122 |
| 2024/0381697 | A1* | 11/2024 | Yang | H10K 59/122 |
| 2024/0389394 | A1* | 11/2024 | Park | H10K 59/38 |

* cited by examiner

PDL: IPL, ML1, ML2
ST1: PR1, DEL1, DCE1
ST2: PR2, DEL2, DCE2

PDL : IPL , ML1 , ML2
ST1 : PR1 , DEL1 , DCE1
ST2 : PR2 , DEL2 , DCE2
ST3 : PR3 , DEL3 , DCE3

DISPLAY DEVICE AND METHOD OF MANUFACTURING THE SAME

This application claims priority to Korean Patent Application No. 10-2023-0058641, filed on May 4, 2023, and all the benefits accruing therefrom under 35 U.S.C. § 119, the content of which in its entirety is herein incorporated by reference.

BACKGROUND

1. Field

The disclosure relates to a display device and a method of manufacturing the display device.

2. Description of the Related Art

A display device is a device that displays an image. The display device may include a pixel defined as a minimum unit that emits light. The pixel may include a pixel electrode, a pixel defining structure defining a pixel opening exposing the pixel electrode, a light emitting material disposed on the pixel electrode in the pixel opening, and a common electrode layer disposed on the light emitting material.

SUMMARY

In a high resolution display device, it is desired to increase the number of pixels arranged in a limited display area to display a high-resolution image. In this case, a size of one pixel may be relatively small, and accordingly, a size of the pixel opening may be relatively small. Accordingly, a difficulty of a process of forming the light emitting material in the pixel opening may increase.

Embodiments provide a display device capable of displaying a high-resolution image.

Embodiments provide a method for manufacturing the display device.

A display device according to an embodiment includes a substrate, a first pixel electrode disposed on the substrate, a pixel defining structure including an inorganic protective layer disposed on the substrate, a first metal layer disposed on the inorganic protective layer, and a second metal layer disposed on the first metal layer and defining a first pixel opening which exposes at least a portion of the first pixel electrode and includes a first undercut structure defined by a first lower surface of the second metal layer not in contact with the first metal layer, a first organic light emitting layer disposed on the first pixel electrode in the first pixel opening, a first common electrode layer disposed on the first organic light emitting layer in the first pixel opening, a first stack layer covering an entire upper surface of the second metal layer of the pixel defining structure and disposed on the pixel defining structure to expose the first pixel opening, a first capping layer entirely covering an upper surface of the first stack layer, a side surface of the first stack layer, a side surface of the pixel defining structure defining the first pixel opening, and an upper surface of the first common electrode layer disposed in the first pixel opening, and a first light extraction structure which fills the first pixel opening covered by the first capping layer and has a convex upper surface over the first pixel opening.

In an embodiment, the first stack layer may include a first photosensitive material layer disposed on the second metal layer, a first dummy organic light emitting layer disposed on the first photosensitive material layer and including the same material as the first organic light emitting layer, and a first dummy common electrode layer disposed on the first dummy organic light emitting layer and including the same material as the first common electrode layer.

In an embodiment, a side surface of the first photosensitive material layer, a side surface of the first dummy organic light emitting layer, and a side surface of the first dummy common electrode layer may be aligned with each other.

In an embodiment, the first common electrode layer may electrically contact the first metal layer in the first pixel opening, and the first pixel electrode may be electrically insulated from the first metal layer by the inorganic protective layer.

In an embodiment, the display device may further include a second pixel electrode disposed on the substrate and spaced apart from the first pixel electrode.

In an embodiment, the pixel defining structure may further define a second pixel opening which exposes at least a portion of the second pixel electrode and includes a second undercut structure defined by a second lower surface of the second metal layer not in contact with the first metal layer, and the first stack layer and the first capping layer may expose the second pixel opening.

In an embodiment, the display device may further include a second organic light emitting layer disposed on the second pixel electrode in the second pixel opening, a second common electrode layer disposed on the second organic light emitting layer in the second pixel opening, a second stack layer disposed on a portion of an upper surface of the first capping layer adjacent to the second pixel opening, a second capping layer entirely covering an upper surface of the second stack layer, a side surface of the second stack layer which is adjacent to the second pixel opening, a side surface of the pixel defining structure defining the second pixel opening, and an upper surface of the second common electrode layer disposed in the second pixel opening, and a second light extraction structure which fills the second pixel opening covered by the second capping layer and has a convex upper surface over the second pixel opening.

In an embodiment, the second stack layer may include a second photosensitive material layer disposed on the portion of the upper surface of the first capping layer adjacent to the second pixel opening, a second dummy organic light emitting layer disposed on the second photosensitive material layer and including a same material as the second organic light emitting layer, and a second dummy common electrode layer disposed on the second dummy organic light emitting layer and including a same material as the second common electrode layer.

In an embodiment, a first groove may be further defined in the pixel defining structure between the first pixel electrode and the second pixel electrode, the first groove may include an undercut structure defined by a third lower surface of the second metal layer not in contact with the first metal layer, a dummy organic light emitting layer including a same material as the first organic light emitting layer and a connection electrode layer disposed on the dummy organic light emitting layer and including a same material as the first common electrode layer may be disposed in the first groove, and the connection electrode layer may electrically contact the first metal layer in the first groove.

In an embodiment, the display device may further include a third pixel electrode disposed on the substrate and spaced apart from the first pixel electrode and the second pixel electrode, the pixel defining structure may further define a third pixel opening which exposes at least a portion of the third pixel electrode and includes a third undercut structure defined by a fourth lower surface of the second metal layer not in contact with the first metal layer, and the first stack layer and the first capping layer may expose the third pixel opening.

In an embodiment, the display device may further include a third organic light emitting layer disposed on the third pixel electrode in the third pixel opening, a third common electrode layer disposed on the third organic light emitting layer in the third pixel opening, a second stack layer disposed on a portion of an upper surface of the first capping layer adjacent to the third pixel opening, a second capping layer covering an upper surface of the second stack layer which is adjacent to the third pixel opening, a third stack layer covering an upper surface of the second capping layer which is adjacent to the third pixel opening, a third capping layer entirely covering an upper surface of the third stack layer, a side surface of the third stack layer which is adjacent to the third pixel opening, a side surface of the pixel defining structure defining the third pixel opening, and an upper surface of the third common electrode layer disposed in the third pixel opening, and a third light extraction structure which fills the third pixel opening covered by the third capping layer and has a convex upper surface over the third pixel opening.

In an embodiment, the third stack layer may include a third photosensitive material layer disposed on the portion of the upper surface of the second capping layer adjacent to the third pixel opening, a third dummy organic light emitting layer disposed on the third photosensitive material layer and including a same material as the third organic light emitting layer, and a third dummy common electrode layer disposed on the third dummy organic light emitting layer and including a same material as the third common electrode layer.

In an embodiment, the display device may further include an organic encapsulation layer disposed on the first capping layer and the first light extraction structure and covering the first capping layer and the first light extraction structure and an inorganic encapsulation layer disposed on the organic encapsulation layer and covering the organic encapsulation layer.

A method of manufacturing a display device according to an embodiment includes forming a first pixel electrode, a second pixel electrode and a third pixel electrode, which are spaced apart from each other, on a substrate, forming an inorganic protective layer covering the first pixel electrode, the second pixel electrode, and the third pixel electrode entirely over the substrate, forming a first metal layer entirely on the inorganic protective layer, forming a second metal layer entirely over the first metal layer, forming a first photosensitive material layer entirely on the second metal layer, exposing and developing a portion of the first photosensitive material layer, forming a first pixel opening exposing a portion of the first pixel electrode through the first metal layer and the second metal layer using the first photosensitive material layer as a mask, forming a first organic light emitting material entirely on the substrate, forming a first conductive material entirely over the substrate, forming a first capping layer entirely over the substrate, and forming a first light extraction structure filling the first pixel opening and having a convex upper surface over the first pixel opening.

In an embodiment, the forming the first pixel opening may include dry etching the second metal layer, the first metal layer, and the inorganic protective layer using the first photosensitive material layer as a mask and wet etching the first metal layer.

In an embodiment, the method may include forming a first groove positioned between the first pixel electrode and the second pixel electrode and a second groove positioned between the second pixel electrode and the third pixel electrode using the first photosensitive material layer as a mask.

In an embodiment, the method may further include after the forming the first capping layer entirely, forming a second photosensitive material layer entirely on the first capping layer, exposing and developing a portion of the second photosensitive material layer, forming a second pixel opening exposing a portion of the second pixel electrode through the first metal layer and the second metal layer using the second photosensitive material layer as a mask, forming a second organic light emitting material entirely on the substrate, forming a second conductive material entirely over the substrate, forming a second capping layer entirely over the substrate, forming a third photosensitive material layer entirely on the second capping layer, exposing and developing a portion of the third photosensitive material layer, forming a third pixel opening exposing a portion of the third pixel electrode through the first metal layer and the second metal layer using the third photosensitive material layer as a mask, forming a third organic light emitting material entirely on the substrate, forming a third conductive material entirely over the substrate, and forming a third capping layer entirely over the substrate.

In an embodiment, the method may further include after the forming the third capping layer entirely, forming a third light extraction structure filling the third pixel opening and having a convex upper surface over the third pixel opening, and etching a portion of the third capping layer, a portion of the third conductive material, a portion of the third organic light emitting material, and a portion of the third photosensitive material layer using the third light extraction structure as a mask.

In an embodiment, the method may further include after the etching the portion of the third capping layer, the portion of the third conductive material, the portion of the third organic light emitting material, and the portion of the third photosensitive material layer, forming a second light extraction structure filling the second pixel opening and having a convex upper surface over the second pixel opening, and etching a portion of the second capping layer, a portion of the second conductive material, a portion of the second organic light emitting material, and a portion of the second photosensitive material layer using the second light extraction structure as a mask.

In an embodiment, the method may further include after the forming the first light extracting structure, forming an organic encapsulation layer entirely on the substrate and forming an inorganic encapsulation layer entirely on the organic encapsulation layer.

The display device according to embodiments includes a substrate, a first pixel electrode disposed on the substrate, a pixel defining structure including an inorganic protective layer disposed on the substrate, a first metal layer disposed on the inorganic protective layer, and a second metal layer disposed on the first metal layer and defining a first pixel opening, where the first pixel opening exposes at least a portion of the first pixel electrode and includes a first undercut structure defined by a first lower surface of the second metal layer not in contact with the first metal layer, a first organic light emitting layer disposed on the first pixel electrode in the first pixel opening, a first common electrode layer disposed on the first organic light emitting layer in the first pixel opening, a first stack layer covering an entire upper surface of the second metal layer of the pixel defining structure and disposed on the pixel defining structure to expose the first pixel opening, a first capping layer entirely covering an upper surface of the first stack layer, a side surface of the first stack layer, a side surface of the pixel defining structure defining the first pixel opening, and an upper surface of the first common electrode layer disposed in the first pixel opening, and a first light extraction structure which fills the first pixel opening covered by the first capping layer and has a convex upper surface over the first pixel opening. Accordingly, the first organic light emitting layer may be effectively formed in the first pixel opening having a relatively small area using the first undercut structure.

The method of manufacturing a display device according to embodiments includes forming a first pixel electrode, a second pixel electrode, and a third pixel electrode spaced apart from each other on a substrate, forming an inorganic protective layer covering the first pixel electrode, the second pixel electrode, and the third pixel electrode entirely over the substrate, forming a first metal layer entirely on the inorganic protective layer, forming a second metal layer entirely over the first metal layer, forming a first photosensitive material layer entirely on the second metal layer, exposing and developing a portion of the first photosensitive material layer, forming a first pixel opening exposing a portion of the first pixel electrode through the first metal layer and the second metal layer using the first photosensitive material layer as a mask, forming a first organic light emitting material entirely on the substrate, forming a first conductive material entirely over the substrate, forming a first capping layer entirely over the substrate, and forming a first light extraction structure filling the first pixel opening and having a convex upper surface over the first pixel opening. Accordingly, the first organic light emitting material may be entirely formed without using a separate mask (e.g., an FMM mask).

It is to be understood that both the foregoing general description and the following detailed description are exemplary and explanatory and are intended to provide further explanation of the invention as claimed.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Figure 1:
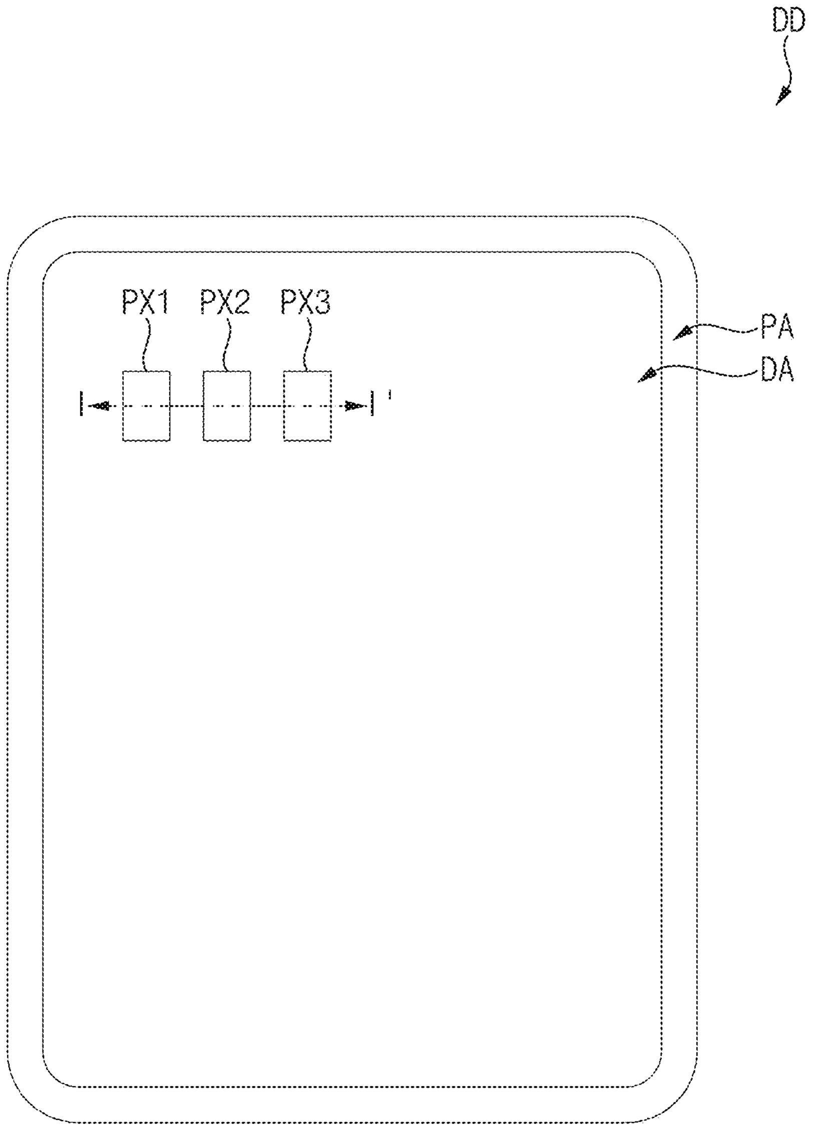
FIG. 1 is a plan view illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being “on” another element, it can be directly on the other element or intervening elements may be present therebetween. In contrast, when an element is referred to as being “directly on” another element, there are no intervening elements present.

It will be understood that, although the terms “first,” “second,” “third” etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, “a first element,” “component,” “region,” “layer” or “section” discussed below could be termed a second element, component, region, layer or section without departing from the teachings herein.

The terminology used herein is for the purpose of describing particular embodiments only and is not intended to be limiting. As used herein, “a”, “an,” “the,” and “at least one” do not denote a limitation of quantity, and are intended to include both the singular and plural, unless the context clearly indicates otherwise. For example, “an element” has the same meaning as “at least one element,” unless the context clearly indicates otherwise. “At least one” is not to be construed as limiting “a” or “an.” “Or” means “and/or.” As used herein, the term “and/or” includes any and all combinations of one or more of the associated listed items. It will be further understood that the terms “comprises” and/or “comprising,” or “includes” and/or “including” when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as “lower” or “bottom” and “upper” or “top,” may be used herein to describe one element’s relationship to another element as illustrated in the Figures. It will be understood that relative terms are intended to encompass different orientations of the device in addition to the orientation depicted in the Figures. For example, if the device in one of the figures is turned over, elements described as being on the “lower” side of other elements would then be oriented on “upper” sides of the other elements. The term “lower,” can therefore, encompasses both an orientation of “lower” and “upper,” depending on the particular orientation of the figure. Similarly, if the device in one of the figures is turned over, elements described as “below” or “beneath” other elements would then be oriented “above” the other elements. The terms “below” or “beneath” can, therefore, encompass both an orientation of above and below.

“About” or “approximately” as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, “about” can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is a plan view illustrating a display device according to an embodiment.

Referring to FIG. 1, an embodiment of the display device DD may include a display area DA and a peripheral area PA.

The display area DA may be an area displaying an image. A plurality of pixels may be disposed in the display area DA. The plurality of pixels may include a first pixel PX1, a second pixel PX2, and a third pixel PX3.

The first pixel PX1 may emit light of a first color. The second pixel PX2 may emit light of a second color different from the first color. The third pixel PX3 may emit light of a third color different from the first color and the second color.

The first pixel PX1, the second pixel PX2, and the third pixel PX3 may be disposed adjacent to each other. In an embodiment, for example, as shown in FIG. 1, the first pixel PX1, the second pixel PX2, and the third pixel PX3 may be sequentially arranged in one direction. However, the arrangement of the first pixel PX1, the second pixel PX2, and the third pixel PX3 on a plane is not limited to the in FIG. 1, and the first pixel PX1, the second pixel PX2, and the third pixel PX3 may be arranged according to various known planar arrangements.

Although FIG. 1 shows only one first pixel PX1, one second pixel PX2, and one third pixel PX3 for convenience of illustration and description, the first pixel PX1 and the second pixel PX2, and the third pixel PX3 may be provided in plurality in the display area DA.

The peripheral area PA may be adjacent to at least one side of the display area DA. In an embodiment, for example, as shown in FIG. 1, the peripheral area PA may surround the display area DA. A driving circuit unit for providing (or transmitting) a driving signal to the plurality of pixels may be disposed in the peripheral area PA.

Figure 2:
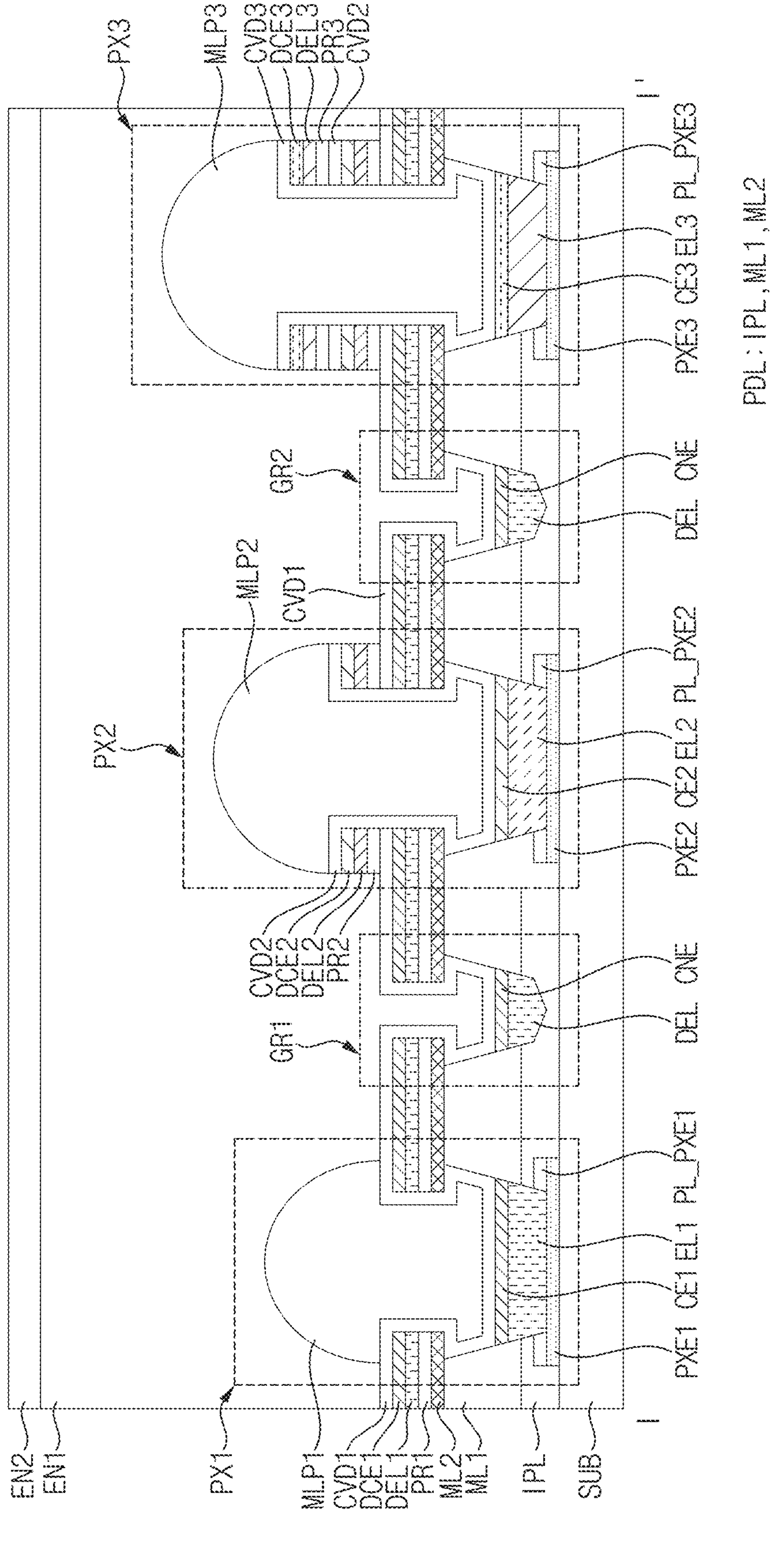
FIG. 2 is a cross-sectional view taken along line I-I' of FIG. 1.

FIG. 2 is a cross-sectional view taken along line I-I' of FIG. 1.

Referring to FIG. 2, an embodiment of the display device DD may include a substrate SUB, the first pixel PX1, the second pixel PX2, the third pixel PX3, an organic encapsulation layer EN1, and an inorganic encapsulation layer EN2.

Each of the first pixel PX1, the second pixel PX2, and the third pixel PX3 may be disposed on the substrate SUB. Each of the first pixel PX1, the second pixel PX2, and the third pixel PX3 may emit light.

The organic encapsulation layer EN1 may be disposed on the substrate SUB and may cover the first pixel PX1, the second pixel PX2, and the third pixel PX3. The organic encapsulation layer EN1 may include an organic insulating material.

The inorganic encapsulation layer EN2 may be disposed on the organic encapsulation layer EN1 and may cover the organic encapsulation layer EN1. The inorganic encapsulation layer EN2 may include an inorganic insulating material.

The organic encapsulation layer EN1 and the inorganic encapsulation layer EN2 may block the moisture introduced from the outside of the display device DD. Thus, the organic encapsulation layer EN1 and the inorganic encapsulation layer EN2 may serve to protect the first pixel PX1, the second pixel PX2, and the third pixel PX3.

Figure 3:
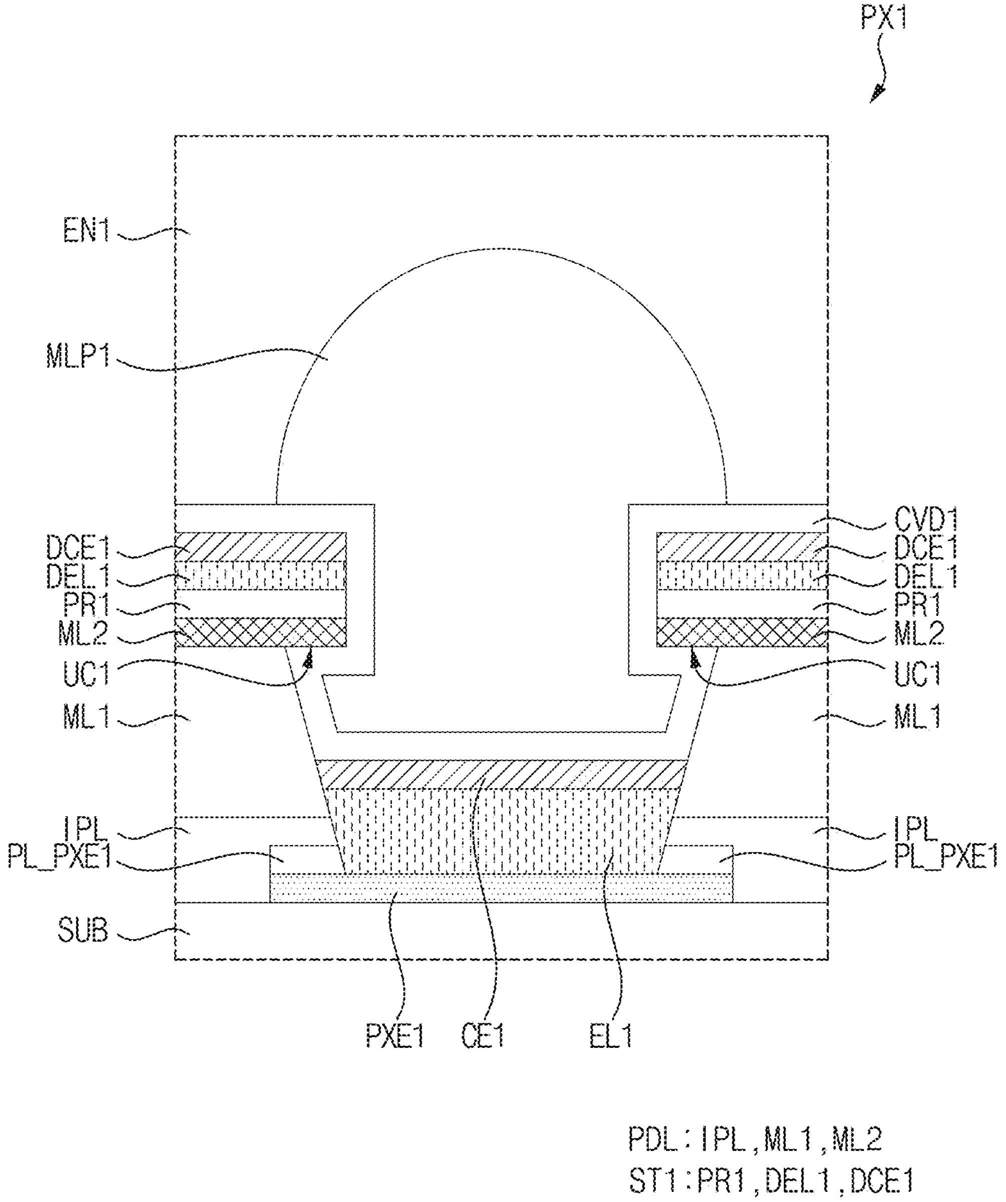
FIG. 3 is a cross-sectional view illustrating a first pixel of FIG. 2.

FIG. 3 is a cross-sectional view illustrating a first pixel of FIG. 2.

Referring to FIGS. 2 and 3, in an embodiment, the first pixel PX1 may include a first pixel electrode PXE1, a first pixel electrode protective layer PL_PXE1, an inorganic protective layer IPL, a first metal layer ML1, a second metal layer ML2, a first organic light emitting layer EL1, a first common electrode layer CE1, a first stack layer ST1, a first capping layer CVD1, and a first light extraction structure MLP1.

The substrate SUB may include a pixel circuit. The pixel circuit may include at least one transistor and at least one capacitor.

The first pixel electrode PXE1 may be disposed on the substrate SUB. The first pixel electrode PXE1 may be electrically connected to the pixel circuit. The first pixel electrode PXE1 may include a conductive material. In an embodiment, for example, the first pixel electrode PXE1 may include indium tin oxide (ITO). In an embodiment, the first pixel electrode PXE1 may be referred to as an anode electrode.

The first pixel electrode protective layer PL_PXE1 may be disposed on the first pixel electrode PXE1. In an embodiment, the first pixel electrode protective layer PL_PXE1 may be disposed on an edge of the first pixel electrode PXE1. The first pixel electrode protective layer PL_PXE1 may include metal oxide. In an embodiment, for example, the first pixel electrode protective layer PL_PXE1 may include indium gallium zinc oxide (IGZO).

The inorganic protective layer IPL, the first metal layer ML1 and the second metal layer ML2 may be sequentially stacked and disposed on the substrate SUB. The inorganic protective layer IPL, the first metal layer ML1 and the second metal layer ML2 may be referred to as a pixel defining structure PDL.

In an embodiment, the inorganic protective layer IPL may cover the edge of the first pixel electrode PXE1. In such an embodiment, the first pixel electrode protective layer PL_PXE1 may be disposed between the inorganic protective layer IPL and the edge of the first pixel electrode PXE1. The first pixel electrode PXE1 may be electrically insulated from the first metal layer ML1 by the inorganic protective layer IPL. In addition, the first pixel electrode protective layer PL_PXE1 may not directly contact the first metal layer ML1 due to the inorganic protective layer IPL.

The first metal layer ML1 may be disposed on the inorganic protective layer IPL. The first metal layer ML1 may include a metal material.

The second metal layer ML2 may be disposed on the first metal layer ML2. The second metal layer ML2 may include a metal material.

In an embodiment, the metal material included in the first metal layer ML1 may be a different material from the metal material included in the second metal layer ML2. In an embodiment, for example, the metal material included in the first metal layer ML1 may be relatively more etched under a first etching condition (e.g., a wet etching condition exposed to a first etchant for a first time), the metal material included in the second metal layer ML2 may be relatively less etched under the first etching condition. In an embodiment, for example, the first metal layer ML1 may include aluminum, and the second metal layer ML2 may include titanium.

A first pixel opening PXO1 (in FIG. 9) exposing at least a portion of the first pixel electrode PXE1 may be defined in the pixel defining structure PDL. In an embodiment, the first pixel opening (PXO1 in FIG. 9), that is, a portion of the pixel defining structure PDL defining the first pixel opening, may include a first undercut structure UC1. The first undercut structure UC1 may be defined as a portion including a lower surface (or a first lower surface) of the second metal layer ML2 not in contact with the first metal layer ML1 is located.

The first organic light emitting layer EL1 may be disposed in the first pixel opening PXO1. The first organic light emitting layer EL1 may include a first organic light emitting material that emits light of the first color.

In an embodiment, a level of an upper surface of the first organic light emitting layer EL1 may be higher than a level of an upper surface of the inorganic protective layer IPL. That is, the first organic light emitting layer EL1 may be disposed to cover an entire side surface of the inorganic protective layer IPL in the first pixel opening PXO1. Here, a level of a surface may be defined as a height of the surface with respect to an upper surface of the substrate SUB.

The first common electrode layer CE1 may be disposed on the first organic light emitting layer EL1 in the first pixel opening PXO1. The first common electrode layer CE1 may include a transparent conductive material. In an embodiment, the first common electrode layer CE1 may be referred to as a cathode electrode.

In an embodiment, the first common electrode layer CE1 may directly contact the first metal layer ML1 in the first pixel opening PXO1. Accordingly, the first common electrode layer CE1 may be electrically connected to the first metal layer ML1.

The first stack layer ST1 may be disposed on the second metal layer ML2 to cover an entire upper surface of the second metal layer ML2. The first stack layer ST1 may include a first photosensitive material layer PR1, a first dummy organic light emitting layer DEL1, and a first dummy common electrode layer DCE1.

The first photosensitive material layer PR1 may be disposed on the second metal layer ML2. The first photosensitive material layer PR1 may cover the entire upper surface of the second metal layer ML2. The first photosensitive material layer PR1 may include a photosensitive material (e.g., a photoresist material).

The first dummy organic light emitting layer DEL1 may be disposed on the first photosensitive material layer PR1. The first dummy organic light emitting layer DEL1 may cover an entire upper surface of the first photosensitive material layer PR1. The first dummy organic light emitting layer DEL1 may include a same material as the first organic light emitting layer EL1. In an embodiment, for example, the first dummy organic light emitting layer DEL1 may include the first organic light emitting material. In such an embodiment, no light may be substantially emitted from the first dummy organic light emitting layer DEL1.

The first dummy common electrode layer DCE1 may be disposed on the first dummy organic light emitting layer DEL1. The first dummy common electrode layer DCE1 may cover an entire upper surface of the first dummy organic light emitting layer DEL1. The first dummy common electrode layer DCE1 may include a same material as the first common electrode layer CE1. In an embodiment, for example, the first dummy common electrode layer DCE1 may include a transparent conductive material.

In an embodiment, as shown in FIGS. 2 and 3, a side surface of the second metal layer ML2, a side surface of the first photosensitive material layer PR1, a side surface of the first dummy organic light emitting layer DEL1 and a side surface of the first dummy common electrode layer DCE1 may be aligned (e.g., substantially vertically) with each other.

The first capping layer CVD1 may entirely cover an upper surface of the first stack layer ST1, a side surface of the first stack layer ST1, a side surface of the pixel defining structure PDL defining the first pixel opening PXO1, and an upper surface of the first common electrode layer CE1 disposed in the first pixel opening PXO1. The first capping layer CVD1 may include an inorganic insulating material.

In an embodiment, as shown in FIG. 3, the first capping layer CVD1 may be disposed with a uniform thickness along a profile of the upper surface of the first stack layer ST1, the side surface of the first stack layer ST1, a side surface of the pixel defining structure PDL defining the first pixel opening PXO1, and the upper surface of the first common electrode layer CE1 disposed in the first pixel opening PXO1.

In such an embodiment, as shown in FIG. 2, in a region where the second pixel PX2 is located, the first capping layer CVD1 may not cover a side surface of the first stack layer ST1, a side surface of the pixel defining structure PDL defining a second pixel opening PXO2 (in FIG. 13), and an upper surface of the first common electrode layer CE1 disposed in the second pixel opening PXO2.

In an embodiment, as shown in FIG. 2, in a region where the third pixel PX3 is located, the first capping layer CVD1 may not cover a side surface of the first stack layer ST1, a side surface of the pixel defining structure PDL defining a third pixel opening PXO2 (in FIG. 17), and an upper surface of the first common electrode layer CE1 disposed in the third pixel opening PXO3.

The first light extraction structure MLP1 may fill the first pixel opening PXO1 covered by the first capping layer CVD1, that is, fill a space defined by a portion of the first capping layer CVD1 in the first pixel opening PXO1. In an embodiment, the first light extraction structure MLP1 may have a convex upper surface over (or on and covering) the first pixel opening PXO1. In such an embodiment, the convex upper surface of the first light extraction structure MLP1 may protrude further upwardly than the first capping layer CVD1 covering the upper surface of the first stack layer ST1.

The first light extraction structure MLP1 may include an organic material having a relatively high refractive index. In an embodiment, the refractive index of the first light extraction structure MLP1 may be greater than a refractive index of the organic encapsulation layer EL1. In an embodiment, for example, the refractive index of the organic material included in the first light extraction structure MLP1 may be about 1.60 or greater. Accordingly, front light emitting efficiency of the first color light emitted from the first organic light emitting layer EL1 may be improved. In other words, light emitted from the first organic light emitting layer EL1 in a direction crossing a thickness direction of the display device DD may be refracted at an interface between the first light extraction structure MLP1 and the organic encapsulation layer EL1, such that the light may travel substantially vertically or in a direction substantially parallel to the thickness direction of the display device DD.

Figure 4:
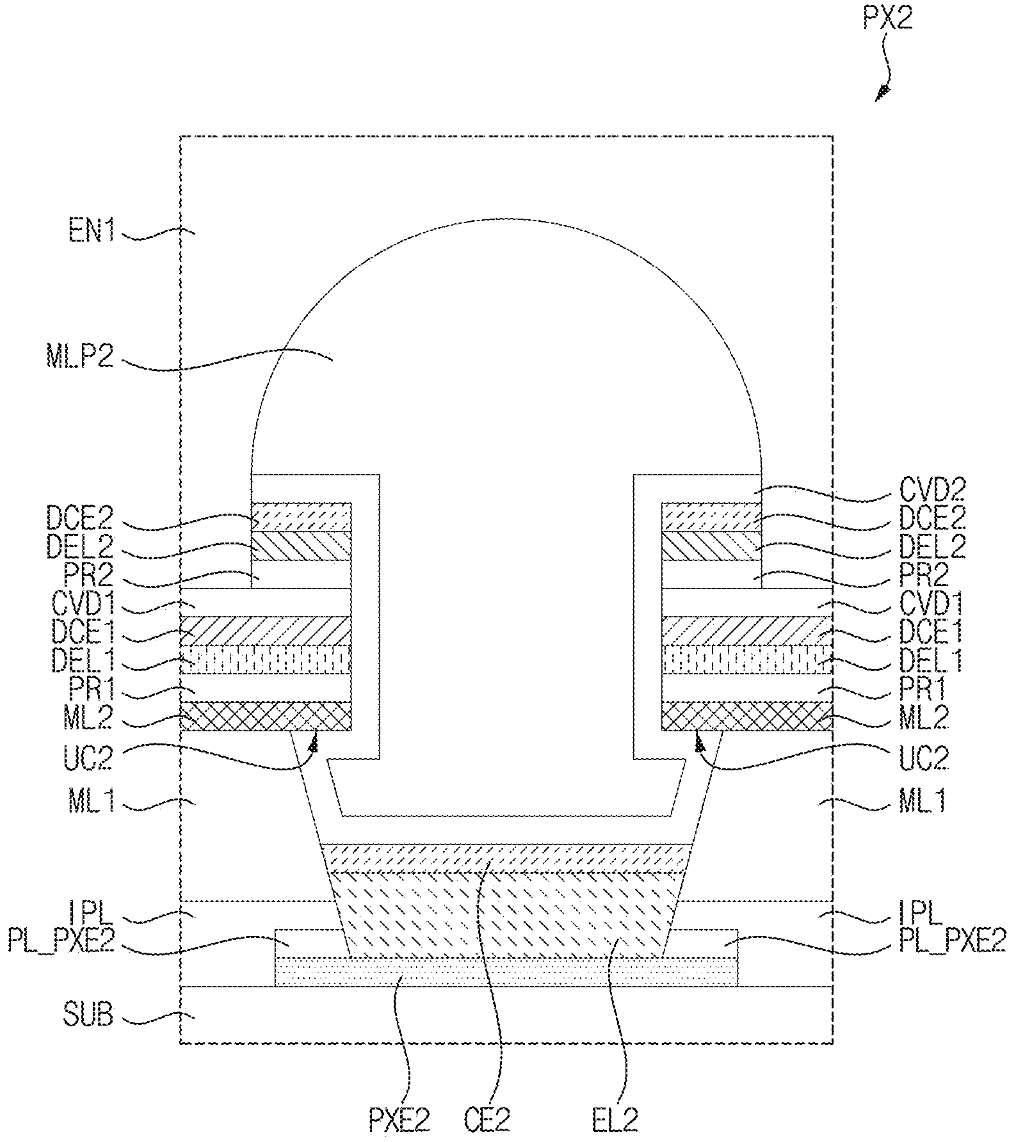
FIG. 4 is a cross-sectional view illustrating a second pixel of FIG. 2.

FIG. 4 is a cross-sectional view illustrating a second pixel of FIG. 2.

Referring to FIGS. 2 and 4, in an embodiment, the second pixel PX2 may include a second pixel electrode PXE2, a second pixel electrode protective layer PL_PXE2, the inorganic protective layer IPL, the first metal layer ML1, the second metal layer ML2, a second organic light emitting layer EL2, a second common electrode layer CE2, the first stack layer ST1, the first capping layer CVD1, a second stack layer ST2, a second capping layer CVD2, and a second light extraction structure MLP2.

Since the substrate SUB is substantially the same as the substrate SUB described with reference to FIG. 3, any repetitive detailed description thereof will be omitted.

The second pixel electrode PXE2 may be disposed on the substrate SUB. The second pixel electrode PXE2 may be spaced apart from the first pixel electrode PXE1. The second pixel electrode PXE2 may be electrically connected to a pixel circuit included in the substrate SUB. The second pixel electrode PXE2 may include a conductive material. In an embodiment, for example, the second pixel electrode PXE2 may include ITO. In an embodiment, the second pixel electrode PXE2 may be referred to as an anode electrode.

The second pixel electrode protective layer PL_PXE2 may be disposed on the second pixel electrode PXE2. The second pixel electrode protective layer PL_PXE2 may be disposed on an edge of the second pixel electrode PXE2. The second pixel electrode protective layer PL_PXE2 may include metal oxide. In an embodiment, for example, the second pixel electrode protective layer PL_PXE2 may include IGZO.

The inorganic protective layer IPL, the first metal layer ML1 and the second metal layer ML2 may substantially the same as the inorganic protective layer IPL, the first metal layer ML1 and the second metal layer ML2 described with reference to FIG. 3. Accordingly, any repetitive detailed description thereof will be omitted. The inorganic protective layer IPL, the first metal layer ML1 and the second metal layer ML2 may be referred to as the pixel defining structure PDL.

In an embodiment, the inorganic protective layer IPL may cover the edge of the second pixel electrode PXE2. In such an embodiment, the second pixel electrode protective layer PL_PXE2 may be disposed between the inorganic protective layer IPL and the edge of the second pixel electrode PXE2. The second pixel electrode PXE2 may be electrically insulated from the first metal layer ML1 by the inorganic protective layer IPL. In addition, the second pixel electrode protective layer PL_PXE2 may not directly contact the first metal layer ML1 due to the inorganic protective layer IPL.

The second pixel opening PXO2 (in FIG. 13) exposing at least a portion of the second pixel electrode PXE2 may be defined in the pixel defining structure PDL. In an embodiment, the second pixel opening PXO2, that is, a portion of the pixel defining structure PDL defining the second pixel opening PXO2, may include a second undercut structure UC2. The second undercut structure UC2 may be defined as a portion where a lower surface (or a second lower surface) of the second metal layer ML2 not in contact with the first metal layer ML1 is located.

The second organic light emitting layer EL2 may be disposed in the second pixel opening PXO2. The second organic light emitting layer EL2 may include a second organic light emitting material that emits light of the second color.

In an embodiment, a level of an upper surface of the second organic light emitting layer EL2 may be higher than a level of an upper surface of the inorganic protective layer IPL. That is, the second organic light emitting layer EL2 may be disposed to cover an entire side surface of the inorganic protective layer IPL in the second pixel opening PXO2.

The second common electrode layer CE2 may be disposed on the second organic light emitting layer EL2 in the second pixel opening PXO2. The second common electrode layer CE2 may include a transparent conductive material. In an embodiment, the second common electrode layer CE2 may be referred to as a cathode electrode.

In an embodiment, the second common electrode layer CE2 may directly contact the first metal layer ML1 in the second pixel opening PXO2. Accordingly, the second common electrode layer CE3 may be electrically connected to the first metal layer ML1.

The first stack layer ST1 may be substantially the same as the first stack layer ST1 described with reference to FIG. 3. For example, the first stack layer ST1 may include the first photosensitive material layer PR1, the first dummy organic light emitting layer DEL1, and the first dummy common electrode layer DCE1.

The first capping layer CVD1 may be disposed on a portion of an upper surface of the first capping layer CVD1 adjacent to the second pixel opening PXO2. The second stack layer ST1 may include a second photosensitive material layer PR2, a second dummy organic light emitting layer DEL2, and a second dummy common electrode layer DCE2.

The second photosensitive material layer PR2 may be disposed on the portion of the upper surface of the first capping layer CVD1 adjacent to the second pixel opening PXO2. The second photosensitive material layer PR2 may include a photosensitive material (e.g., a photoresist material).

The second dummy organic light emitting layer DEL2 may be disposed on the second photosensitive material layer PR2. The second dummy organic light emitting layer DEL2 may cover an entire upper surface of the second photosensitive material layer PR2. The second dummy organic light emitting layer DEL2 may include a same material as the second organic light emitting layer EL2. In an embodiment, for example, the second dummy organic light emitting layer DEL2 may include the second organic light emitting material. In such an embodiment, no light may be substantially emitted from the second dummy organic light emitting layer DEL2.

The second dummy common electrode layer DCE2 may be disposed on the second dummy organic light emitting layer DEL2. The second dummy common electrode layer DCE2 may cover an entire upper surface of the second dummy organic light emitting layer DEL2. The second dummy common electrode layer DCE2 may include a same material as the second common electrode layer CE2. In an embodiment, for example, the second dummy common electrode layer DCE2 may include a transparent conductive material.

In an embodiment, as shown in FIG. 4, in a region adjacent to the second pixel opening PXO2, a side surface of the second dummy common electrode layer DCE2, a side surface of the second dummy organic light emitting layer DEL2, a side surface of the second photosensitive material layer PR2, a side surface of the first capping layer CVD1, a side surface of the first dummy common electrode layer DCE1, a side surface of the first dummy organic light emitting layer DEL1, a side surface of the first photosensitive material layer PR1, and a side surface of the second metal layer ML2 may be aligned (e.g., substantially vertically) with each other.

The second capping layer CVD2 may entirely cover an upper surface of the second stack layer ST2, a side surface of the second stack layer ST2 adjacent to the second pixel opening PXO2, a side surface of the first capping layer CVD1 adjacent to the second pixel opening PXO2, a side surface of the first stack layer ST1 adjacent to the second pixel opening PXO2, a side surface of the pixel defining structure PDL defining the second pixel opening PXO2, and an upper surface of the second common electrode layer CE2 disposed in the second pixel opening PXO2. The first capping layer CVD2 may include an inorganic insulating material.

The second light extraction structure MLP2 may fill the second pixel opening PXO2 covered by the second capping layer CVD2. In an embodiment, the second light extraction structure MLP2 may have a convex upper surface over the second pixel opening PXO2. In such an embodiment, the convex upper surface of the second light extraction structure MLP2 may protrude further upwardly than the second capping layer CVD2 covering the upper surface of the second stack layer ST2.

The second light extraction structure MLP2 may include an organic material having a relatively high refractive index. In an embodiment, the refractive index of the second light extraction structure MLP2 may be greater than a refractive index of the organic encapsulation layer EL1. In an embodiment, for example, the refractive index of the organic material included in the second light extraction structure MLP2 may be about 1.60 or greater. Accordingly, front light emitting efficiency of the second color light emitted from the second organic light emitting layer EL2 may be improved. In other words, light emitted from the second organic light emitting layer EL2 in a direction crossing the thickness direction of the display device DD may be refracted at an interface between the second light extraction structure MLP2 and the organic encapsulation layer EL1, such that the light may travel substantially vertically or in a direction substantially parallel to the thickness direction of the display device DD.

Figure 5:
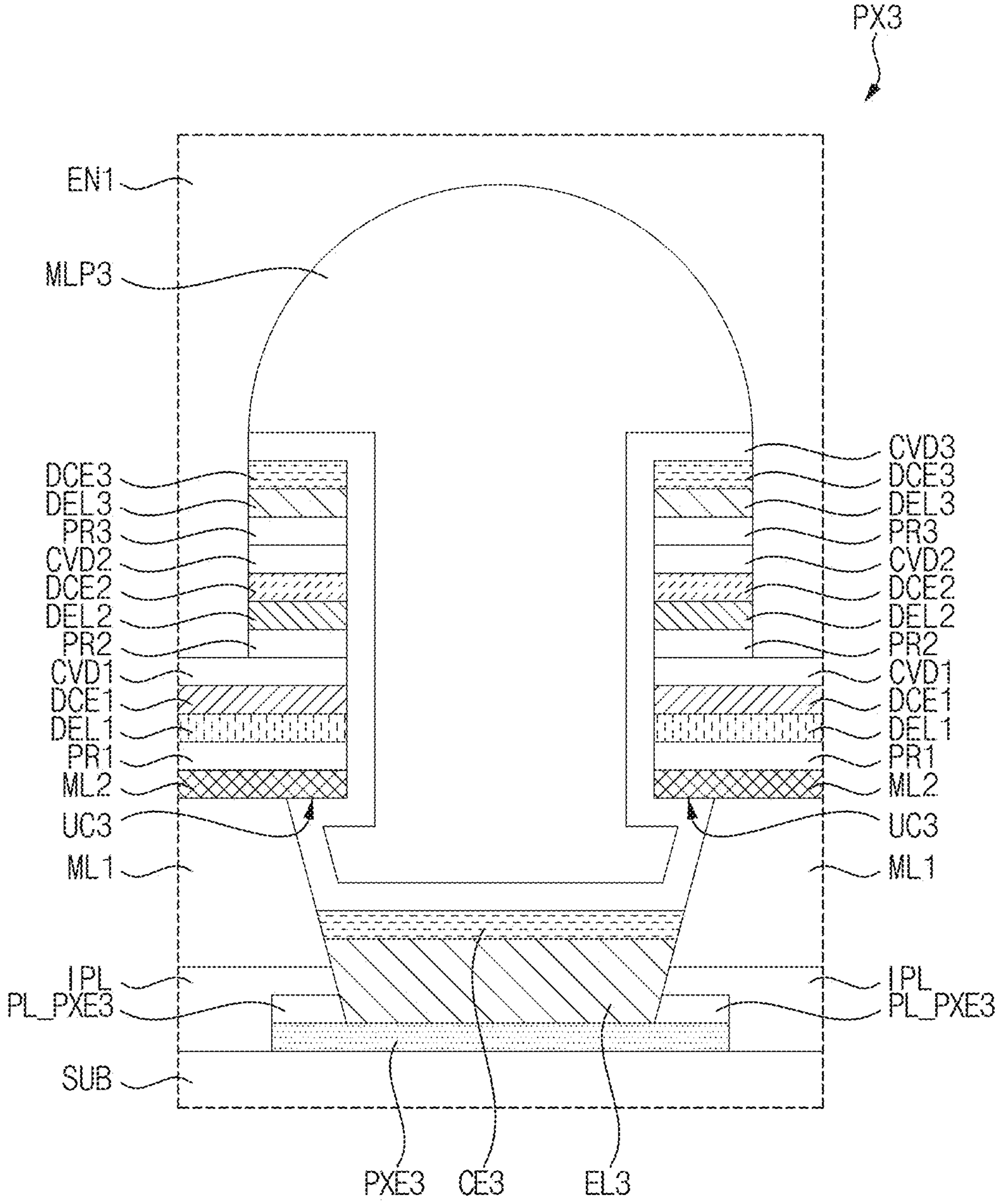
FIG. 5 is a cross-sectional view illustrating a third pixel of FIG. 3.

FIG. 5 is a cross-sectional view illustrating a third pixel of FIG. 3.

Referring to FIGS. 2 and 5, in an embodiment, the third pixel PX3 may include a third pixel electrode PXE3, a third pixel electrode protective layer PL_PXE3, the inorganic protective layer IPL, the first metal layer ML1, the second metal layer ML2, a third organic light emitting layer EL3, a third common electrode layer CE3, the first stack layer ST1, the first capping layer CVD1, the second stack layer ST2, the second capping layer CVD2, a third stack layer ST3, a third capping layer CVD3, and a third light extraction structure MLP3.

Since the substrate SUB is substantially the same as the substrate SUB described with reference to FIG. 3, any repetitive detailed description thereof will be omitted.

The third pixel electrode PXE3 may be disposed on the substrate SUB. The third pixel electrode PXE3 may be spaced apart from the first pixel electrode PXE1 and the second pixel electrode PXE2. The third pixel electrode PXE3 may be electrically connected to a pixel circuit included in the substrate SUB. The third pixel electrode PXE3 may include a conductive material. In an embodiment, for example, the third pixel electrode PXE3 may include ITO. In an embodiment, the third pixel electrode PXE3 may be referred to as an anode electrode.

The third pixel electrode protective layer PL_PXE3 may be disposed on the third pixel electrode PXE3. The third pixel electrode protective layer PL_PXE3 may be disposed on an edge of the third pixel electrode PXE3. The third pixel electrode protective layer PL_PXE3 may include metal oxide. In an embodiment, for example, the third pixel electrode protective layer PL_PXE3 may include IGZO.

The inorganic protective layer IPL, the first metal layer ML1 and the second metal layer ML2 may substantially the same as the inorganic protective layer IPL, the first metal layer ML1 and the second metal layer ML2 described with reference to FIG. 3. Accordingly, any repetitive detailed description thereof will be omitted. The inorganic protective layer IPL, the first metal layer ML1 and the second metal layer ML2 may be referred to as the pixel defining structure PDL.

In an embodiment, the inorganic protective layer IPL may cover the edge of the third pixel electrode PXE3. In such an embodiment, the third pixel electrode protective layer PL_PXE3 may be disposed between the inorganic protective layer IPL and the edge of the third pixel electrode PXE3. The third pixel electrode PXE3 may be electrically insulated from the first metal layer ML1 by the inorganic protective layer IPL. In addition, the third pixel electrode protective layer PL_PXE3 may not directly contact the first metal layer ML1 due to the inorganic protective layer IPL.

The third pixel opening PXO3 (in FIG. 13) exposing at least a portion of the third pixel electrode PXE3 may be defined in the pixel defining structure PDL. In an embodiment, the third pixel opening PXO3, that is, a portion of the pixel defining structure PDL defining the third pixel opening PXO3, may include a third undercut structure UC3. The third undercut structure UC3 may be defined as a portion where a lower surface (or a fourth lower surface) of the second metal layer ML2 not in contact with the first metal layer ML1 is located.

The third organic light emitting layer EL3 may be disposed in the third pixel opening PXO3. The third organic light emitting layer EL3 may include a third organic light emitting material that emits light of the third color.

In an embodiment, a level of an upper surface of the third organic light emitting layer EL2 may be higher than a level of an upper surface of the inorganic protective layer IPL. That is, the third organic light emitting layer EL3 may be disposed to cover an entire side surface of the inorganic protective layer IPL in the third pixel opening PXO3.

The third common electrode layer CE3 may be disposed on the third organic light emitting layer EL3 in the third pixel opening PXO3. The third common electrode layer CE3 may include a transparent conductive material. In an embodiment, the third common electrode layer CE3 may be referred to as a cathode electrode.

In an embodiment, the third common electrode layer CE3 may directly contact the first metal layer ML1 in the third pixel opening PXO3. Accordingly, the third common electrode layer CE1 may be electrically connected to the first metal layer ML1.

The first stack layer ST1 may be substantially the same as the first stack layer ST1 described with reference to FIG. 3. For example, the first stack layer ST1 may include the first photosensitive material layer PR1, the first dummy organic light emitting layer DEL1, and the first dummy common electrode layer DCE1.

The first capping layer CVD1 may not cover a side surface of the first stack layer ST1 adjacent to the third pixel opening PXO3, a side surface of the pixel defining structure PDL defining the third pixel opening PXO3, and an upper surface of the third common electrode layer CE3 disposed in the third pixel opening PXO3. The first capping layer CVD1 may cover the upper surface of the first stack layer ST1.

The second stack layer ST2 may be substantially the same as the second stack layer ST2 described with reference to FIG. 4. For example, the second stack layer ST2 may include the second photosensitive material layer PR2, the second dummy organic light emitting layer DEL2, and the second dummy common electrode layer DCE2.

The second capping layer CVD2 may not cover a side surface of the second stack layer ST2 adjacent to the third pixel opening PXO3, a side surface of the first capping layer CVD1 adjacent to the third pixel opening PXO3, a side surface of the first stack layer ST1 adjacent to the third pixel opening PXO3, a side surface of the pixel defining structure PDL defining the third pixel opening PXO3, and an upper surface of the third common electrode layer CE3 disposed in the third pixel opening PXO3. The second capping layer CVD2 may cover the upper surface of the second stack layer ST2.

The third stack layer ST3 may be disposed on the second capping layer CVD2. The third stack layer ST3 may include a third photosensitive material layer PR3, a third dummy organic light emitting layer DEL3, and a third dummy common electrode layer DCE3.

The third photosensitive material layer PR3 may cover an entire upper surface of the second capping layer CVD2 disposed adjacent to the third pixel opening PXO3. The third photosensitive material layer PR3 may include a photosensitive material (e.g., a photoresist material).

The third dummy organic light emitting layer DEL2 may be disposed on the third photosensitive material layer PR3. The third dummy organic light emitting layer DEL3 may cover an entire upper surface of the third photosensitive material layer PR3. The third dummy organic light emitting layer DEL3 may include a same material as the third organic light emitting layer EL3. In an embodiment, for example, the third dummy organic light emitting layer DEL3 may include the third organic light emitting material. In such an embodiment, no light may be substantially emitted from the third dummy organic light emitting layer DEL3.

The third dummy common electrode layer DCE3 may be disposed on the third dummy organic light emitting layer DEL3. The third dummy common electrode layer DCE3 may cover an entire upper surface of the third dummy organic light emitting layer DEL3. The third dummy common electrode layer DCE3 may include a same material as the third common electrode layer CE3. In an embodiment, for example, the third dummy common electrode layer DCE3 may include a transparent conductive material.

In an embodiment, as shown in FIG. 5, in a region adjacent to the third pixel opening PXO3, a side surface of the third dummy common electrode layer DCE3, a side surface of the third dummy organic light emitting layer DEL3, and a side surface of the third photosensitive material layer PR3, a side surface of the second capping layer CVD2, a side surface of the second dummy common electrode layer DCE2, a side surface of the second dummy organic light emitting layer DEL2, a side surface of the second photosensitive material layer PR2, a side surface of the first capping layer CVD1, a side surface of the first dummy common electrode layer DCE1, a side surface of the first dummy organic light emitting layer DEL1, a side surface of the first photosensitive material layer PR1, and a side surface of the second metal layer ML2 may be aligned (e.g., substantially vertically) with each other.

The third capping layer CVD3 may entirely cover an upper surface of the third stack layer ST3, a side surface of the third stack layer ST3 adjacent to the third pixel opening PXO3, a side surface of the first capping layer CVD1 adjacent to the third pixel opening PXO3, a side surface of the first stack layer ST1 adjacent to the third pixel opening PXO3, a side surface of the pixel defining structure PDL defining the third pixel opening PXO3, and an upper surface of the third common electrode layer CE3 disposed in the third pixel opening PXO3. The third capping layer CVD3 may include an inorganic insulating material.

The third light extraction structure MLP3 may fill the third pixel opening PXO3 covered by the third capping layer CVD3. In an embodiment, the third light extraction structure MLP3 may have a convex upper surface over the third pixel opening PXO3. In such an embodiment, the convex upper surface of the third light extraction structure MLP3 may protrude further upwardly than the third capping layer CVD3 covering the upper surface of the third stack layer ST3.

The third light extraction structure MLP3 may include an organic material having a relatively high refractive index. In an embodiment, the refractive index of the third light extraction structure MLP3 may be greater than a refractive index of the organic encapsulation layer EL1. In an embodiment, for example, the refractive index of the organic material included in the third light extraction structure MLP3 may be about 1.60 or greater. Accordingly, front light emitting efficiency of the second color light emitted from the third organic light emitting layer EL3 may be improved. In other words, light emitted from the third organic light emitting layer EL3 in a direction crossing the thickness direction of the display device DD may be refracted at an interface between the third light extraction structure MLP3 and the organic encapsulation layer EL1, such that the light may travel substantially vertically or in a direction substantially parallel to the thickness direction of the display device DD.

Figure 6:
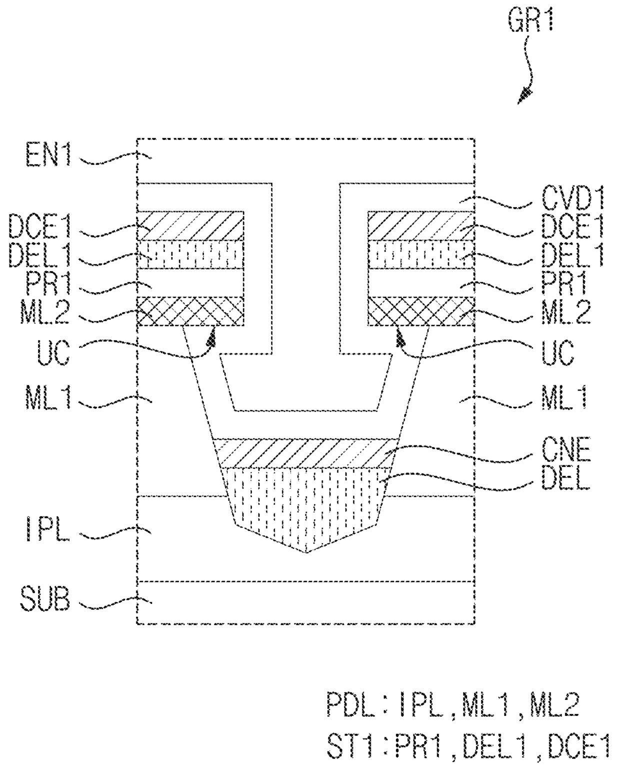
FIG. 6 is a cross-sectional view illustrating a first groove of FIG. 2.

FIG. 6 is a cross-sectional view illustrating a first groove of FIG. 2.

Referring to FIGS. 2 and 6, in an embodiment, a first groove GR1 may be defined between the first pixel PX1 and the second pixel PX2 in the pixel defining structure PDL.

In such an embodiment, the first groove GR1 may be defined between the first pixel PX1 and the second pixel PX2 by the inorganic protective layer IPL, the first metal layer ML1, and the second metal layer ML2. In such an embodiment, the first groove GR1, that is, a portion of the pixel defining structure PDL defining the first groove GR1, may include an undercut structure UC defined as a portion where a lower surface (or a third lower surface) of the second metal layer ML2 not in contact with the first metal layer ML1 is located.

A dummy organic light emitting layer DEL and a connection electrode layer CNE may be disposed in the first groove GR1.

The dummy organic light emitting layer DEL may include a same material as the first organic light emitting layer EL1.

In an embodiment, for example, the dummy organic light emitting layer DEL may include the first organic light emitting material. Light may not be substantially emitted from the dummy organic light emitting layer DEL.

In an embodiment, a level of the upper surface of the dummy organic light emitting layer DEL may be higher than a level of the upper surface of the inorganic protective layer IPL. That is, the dummy organic light emitting layer DEL may cover an entire side surface of the inorganic protective layer IPL in the first groove GR1.

The connection electrode layer CNE may be disposed on the first organic light emitting layer EL1 in the first groove GR1. The connection electrode layer CNE may include a same material as the first common electrode layer CE1. In an embodiment, for example, the connection electrode layer CNE may include a transparent conductive material.

In an embodiment, the connection electrode layer CNE may directly contact the first metal layer ML1 in the first groove GR1. Accordingly, the connection electrode layer CNE may be electrically connected to the first metal layer ML1.

In an embodiment, as described above, the connection electrode layer CNE may be electrically connected to the first metal layer ML1. Also, as described with reference to FIGS. 2 and 3, the first common electrode layer CE1 may be electrically connected to the first metal layer ML1. Also, as described with reference to FIGS. 2 and 4, the second common electrode layer CE2 may be electrically connected to the first metal layer ML1. Accordingly, in such an embodiment, the first common electrode layer CE1 and the second common electrode layer CE2 may be electrically connected to each other through the first metal layer ML1 and the connection electrode layer CNE. That is, substantially the same driving signal (or driving voltage or driving current) may be applied to the first common electrode layer CE1 and the second common electrode layer CE2.

The first stack layer ST1 may be disposed on the second metal layer ML2 adjacent to the first groove GR1. In addition, the first capping layer CVD1 may entirely cover the upper surface of the first stack layer ST1, the side surface of the first stack layer ST1, the first groove GR1, and the connection electrode layer CNE.

The organic encapsulation layer EN1 may be filled in the first groove GR1 covered by the first capping layer CVD1. In an embodiment, the first capping layer CVD1 may cover the first groove GR1 along a cross-sectional profile of the first groove GR1, and thus, a portion of the organic encapsulation layer EN1 filled in the first groove GR1 may be fixed by a step structure defined by the undercut structure UC. That is, the first groove GR1 may serve to prevent peeling of the organic encapsulation layer EN1.

Although only the first groove GR1 has been described with reference to FIG. 6, the second groove GR2 shown in FIG. 2 may be substantially the same as the first groove GR1. That is, a cross-sectional shape of the second groove GR2 may be substantially the same as a cross-sectional shape of the first groove GR1 shown in FIG. 6. Also, the second groove GR2 may be disposed between the second pixel PX2 and the third pixel PX3 and may serve to prevent the organic encapsulation layer EN1 from being peeled off. In addition, the second common electrode layer CE2 and the third common electrode layer CE3 may be electrically connected to each other by the connection electrode layer CNE disposed in the second groove GR2 and electrically connected to the first metal layer ML1.

FIGS. 7 to 25 are cross-sectional views illustrating a method of manufacturing the display device of FIG. 2. Hereinafter, any repetitive detailed descriptions of the same or like elements as those described with reference to FIGS. 2 to 6 may be omitted.

Figure 7:
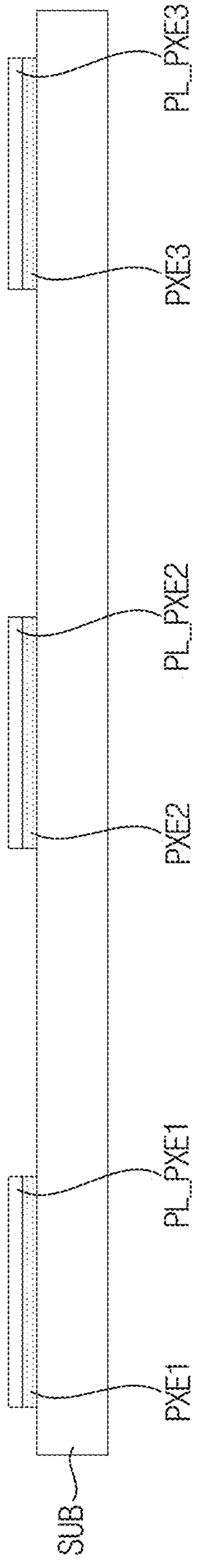
FIGS. 7 to 25 are cross-sectional views illustrating a method of manufacturing the display device of FIG. 2.

Referring to FIG. 7, in an embodiment, a method of manufacturing the display device, the first pixel electrode PXE1, the second pixel electrode PXE2, the third pixel electrode PXE3, the first pixel electrode protective layer PL_PXE1, the second pixel electrode protective layer PL_PXE2, and the third pixel electrode protective layer PL_PXE3 may be formed on the substrate SUB.

A method of forming the first pixel electrode PXE1, the second pixel electrode PXE2, the third pixel electrode PXE3, the first pixel electrode protective layer PL_PXE1, the second pixel electrode protective layer PL_PXE2, and the third pixel electrode protective layer PL_PXE3 is not particularly limited, and various known methods may be used.

Figure 8:
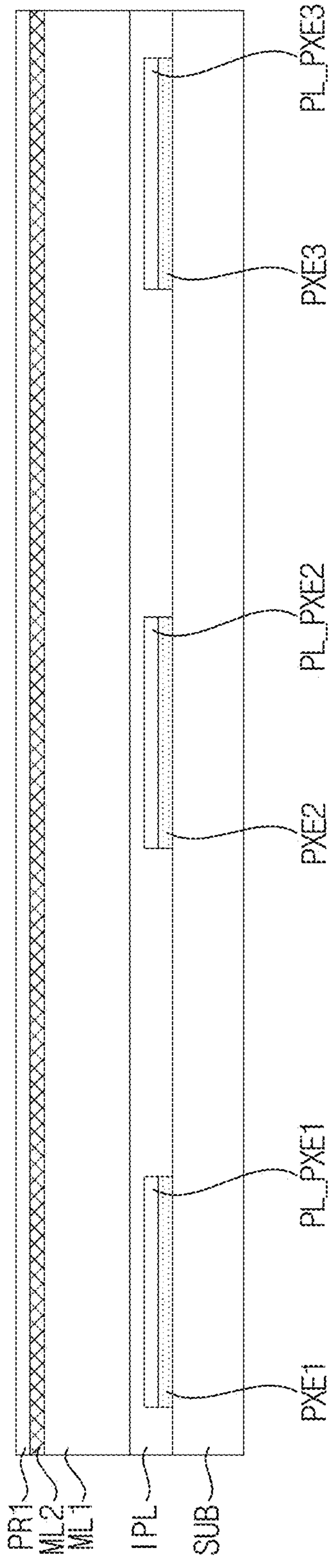

Referring to FIG. 8, the inorganic protective layer IPL, the first metal layer ML1, the second metal layer ML2, and the first photosensitive material layer PR1 may be sequentially formed on the substrate SUB.

Each of the inorganic protective layer IPL, the first metal layer ML1, the second metal layer ML2, and the first photosensitive material layer PR1 may be entirely formed on the substrate SUB. In addition, the inorganic passivation layer IPL may be formed to cover the first pixel electrode PXE1, the second pixel electrode PXE2, the third pixel electrode PXE3, the first pixel electrode protective layer PL_PXE1, the second pixel electrode protective layer PL_PXE2, the third pixel electrode protective layer PL_PXE3.

A method of forming the inorganic protective layer IPL, the first metal layer ML1, the second metal layer ML2, and the first photosensitive material layer PR1 is not particularly limited, and various known methods may be used.

Figure 9:
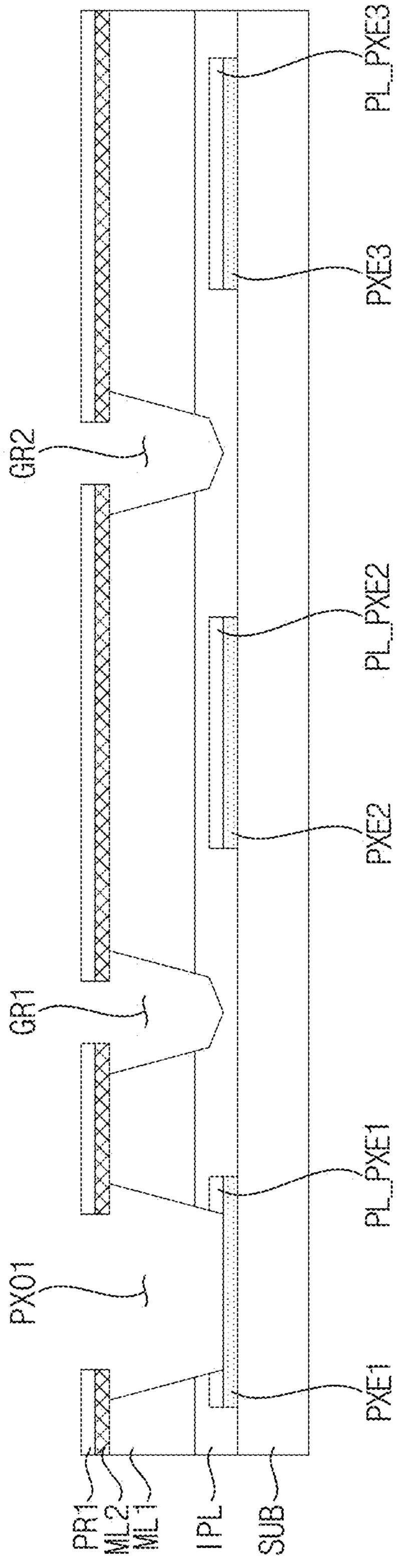

Referring to FIG. 9, a portion of the first photosensitive material layer PR1 may be removed, that is, the first photosensitive material layer PR1 may be patterned, by exposing and developing the first photosensitive material layer PR1. Thereafter, the inorganic protective layer IPL, the first metal layer ML1, and the second metal layer ML2 may be etched using the remaining portions of the first photosensitive material layer PR1 which function as a mask. Accordingly, the first pixel opening PXO1 exposing at least a portion of the first pixel electrode PXE1, the first groove GR1 positioned between the first pixel electrode PXE1 and the second pixel electrode PXE2, and the second groove GR2 positioned between the second pixel electrode PXE2 and the third pixel electrode PXE3 may be formed.

More specifically, referring to a process of forming the first pixel opening PXO1, the inorganic protective layer IPL, the first metal layer ML1, and the second metal layer ML2 may be dry etched using the first photosensitive material layer PR1 as a mask. In this case, at least a portion of the first pixel electrode protective layer PL_PXE1 disposed on the first pixel electrode PXE1 may be simultaneously dry etched.

Thereafter, a wet etching process may be performed to form the first undercut structure UC1 (in FIG. 3) using a difference between an etching selectivity of the first metal layer ML1 and an etching selectivity of the second metal layer ML2. In an embodiment, for example, the first metal layer ML1 and the second metal layer ML2 may be etched by spraying an etchant. In such an embodiment, the first metal layer ML1 may be etched relatively more by the etchant, and the second metal layer ML2 may be etched relatively less by the etchant. In this case, at least a portion of the first pixel electrode protective layer PL_PXE1 disposed on the first pixel electrode PXE1 may be simultaneously etched by the etchant, and thus, the upper surface of the first pixel electrode PXE1 may be exposed and the first pixel electrode protective layer PL_PXE1 may remain only on the edge of the first pixel electrode PXE1.

Figure 10:
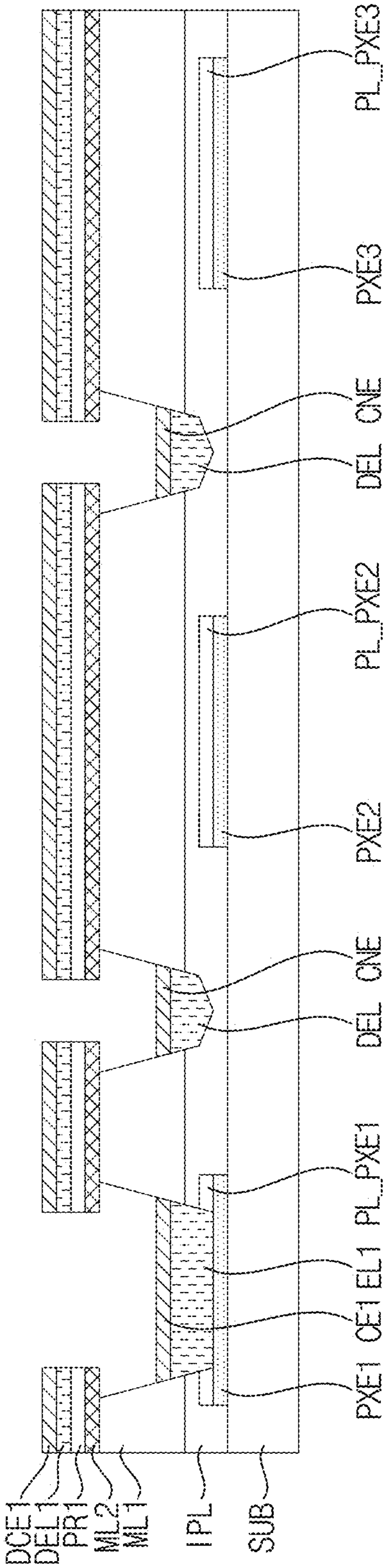

Referring to FIG. 10, after depositing the first organic light emitting material entirely (i.e., over an entire upper surface of the substrate), a transparent conductive material may be deposited entirely.

When the first organic light emitting material is deposited entirely, the first organic light emitting material may be disconnected by the first undercut structure UC1 of the first pixel opening PXO1 and the undercut structure UC of the first groove GR1, and the undercut structure of the second groove GR2.

Accordingly, by depositing the first organic light emitting material entirely, the first organic light emitting layer EL1 disposed in the first pixel opening PXO1, the dummy organic light emitting layer DEL disposed in the first groove GR1, the dummy organic light emitting layer DEL disposed in the second groove GR2, and the first dummy organic light emitting layer DEL1 disposed on the first photosensitive material layer PR1 may be simultaneously formed.

As such, in an embodiment of the invention, a separate mask may not be used in the deposition process of the first organic light emitting material for forming the first organic light emitting layer EL1 in the first pixel opening PXO1. Accordingly, in a case where the area of the first pixel opening PXO1 is relatively small by arranging a relatively large number of pixels PX1, PX2, and PX3 in a display area DA of the display device DD to implement a high resolution, the first organic light emitting layer EL1 may be effectively formed in the first pixel opening PXO1.

When the transparent conductive material is entirely deposited, the transparent conductive material may be disconnected by the first undercut structure UC1 of the first pixel opening PXO1 and the undercut structure UC of the first groove GR1, and the undercut structure of the second groove GR2.

Accordingly, by depositing transparent conductive material entirely, the first common electrode layer CE1 disposed in the first pixel opening PXO1, the connection electrode layer CNE disposed in the first groove GR1, the connection electrode layer CNE disposed in the second groove GR2, and the first dummy common electrode layer DCE1 disposed on the first dummy organic light emitting layer DEL1 may be simultaneously formed.

As such, in an embodiment of the invention, a separate mask may not be used in the deposition process of the transparent conductive material for forming the first common electrode layer CE1 in the first pixel opening PXO1. Accordingly, in the case where the area of the first pixel opening PXO1 is relatively small by arranging a relatively large number of pixels PX1, PX2, and PX3 in the display area DA of the display device DD to implement a high resolution, the first common electrode layer CE1 may be effectively formed in the first pixel opening PXO1.

Figure 11:
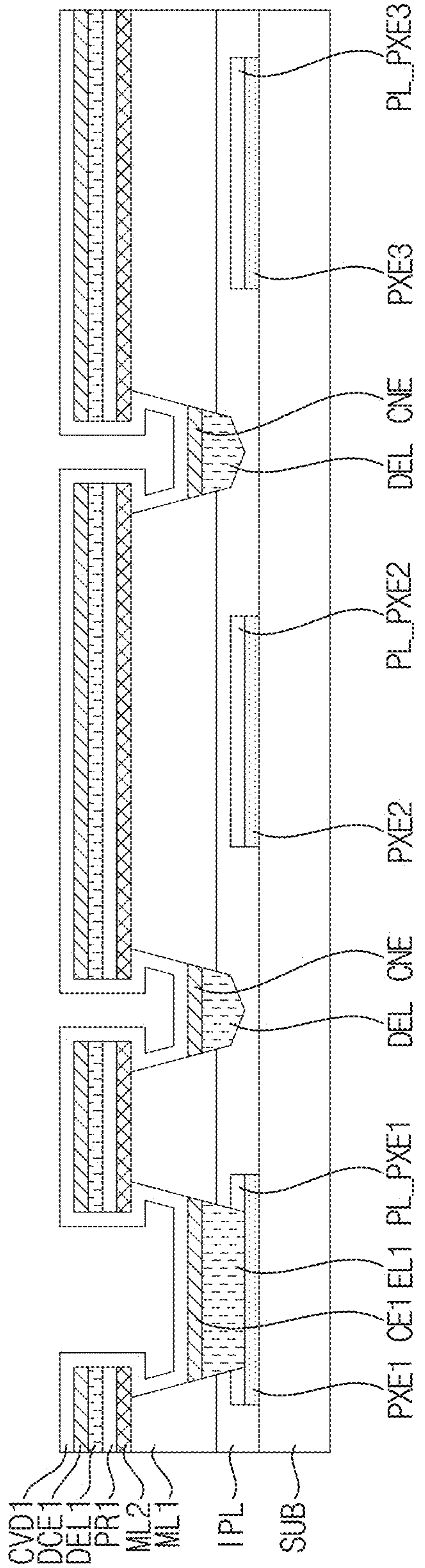

Referring to FIG. 11, the first capping layer CVD1 may be entirely formed. In this case, the first capping layer CVD1 may be formed with a substantially uniform thickness along a cross-sectional profile of components shown in FIG. 10.

A method of forming the first capping layer CVD1 is not particularly limited, and various known methods may be used.

Figure 12:
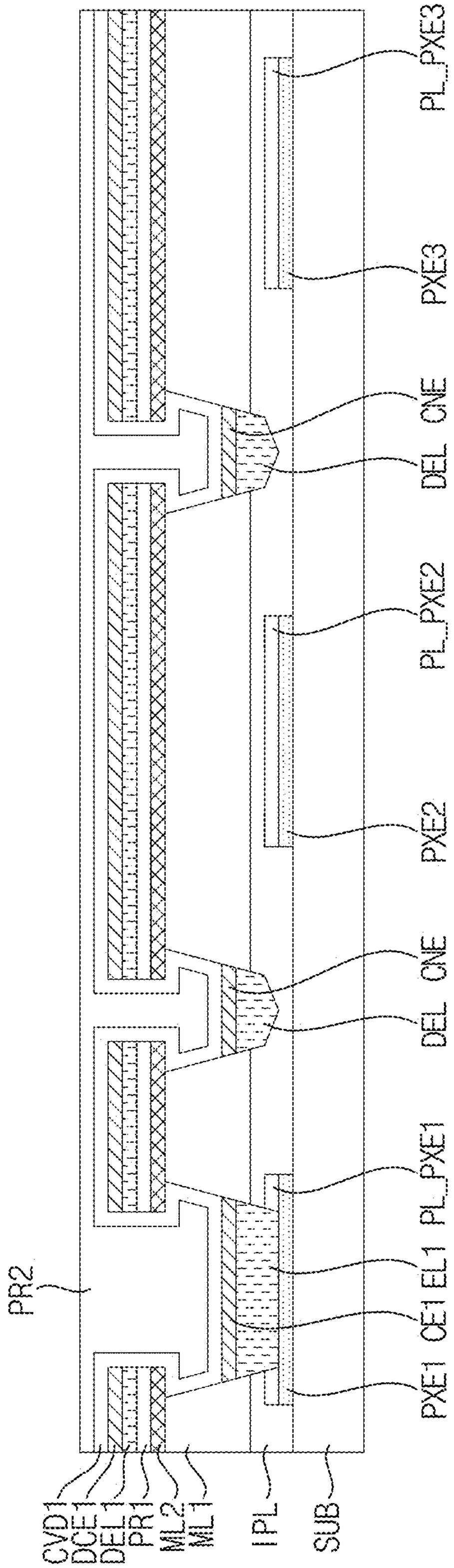

Referring to FIG. 12, the second photosensitive material layer PR2 may be entirely formed. Accordingly, the second photosensitive material layer PR2 may fill the first pixel opening PXO1 covered by the first capping layer CVD1, the first groove GR1 covered by the first capping layer CVD1, and the second groove GR2 covered by the first capping layer CVD1.

Figure 13:
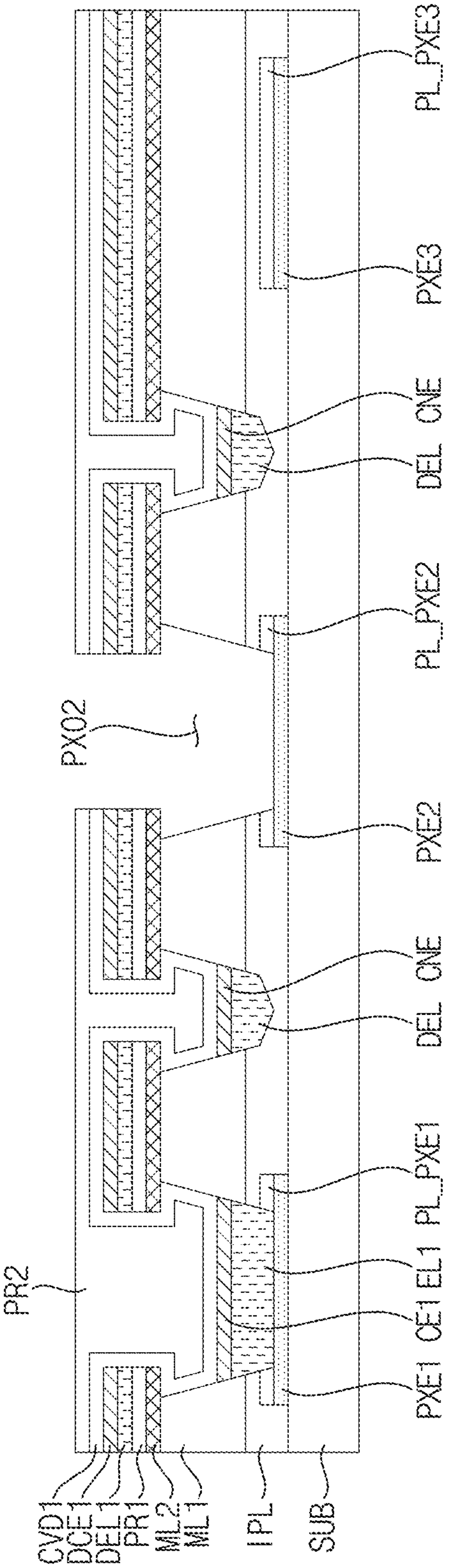

Referring to FIG. 13, a portion of the second photosensitive material layer PR2 may be removed by exposing and developing the second photosensitive material layer PR2. Thereafter, the first capping layer CVD1, the first dummy common electrode layer DCE1, the first dummy organic light emitting layer DEL1, the first photosensitive material layer PR1, the second metal layer ML2, the first metal layer ML1, the inorganic protective layer IPL, and the second pixel electrode protective layer PL_PXE2 may be etched using the remaining portions of the second photosensitive material layer PR2 which function as a mask. Accordingly, the second pixel opening PXO2 exposing at least a portion of the second pixel electrode PXE2 may be formed.

More specifically, the first capping layer CVD1, the first dummy common electrode layer DCE1, the first dummy organic light emitting layer DEL1, and the first photosensitive material layer PR1 may be etched using the second photosensitive material layer PR2 as a mask. In this case, a process for etching the first capping layer CVD1, the first dummy common electrode layer DCE1, the first dummy organic light emitting layer DEL1, and the first photosensitive material layer PR1 may include one or more etching processes. In an embodiment, for example, after a first dry etching process is performed, a first wet etching process may be performed, and then a second dry etching process may be performed.

Thereafter, the inorganic protective layer IPL, the first metal layer ML1, the second metal layer ML2, and the second pixel electrode protective layer PL_PXE2 may be etched to form the second pixel opening PXO2. A method of forming the second pixel opening PXO2 may be substantially the same as the method of forming the first pixel opening PXO1 described with reference to FIG. 9. Therefore, any repetitive detailed description thereof will be omitted.

Figure 14:
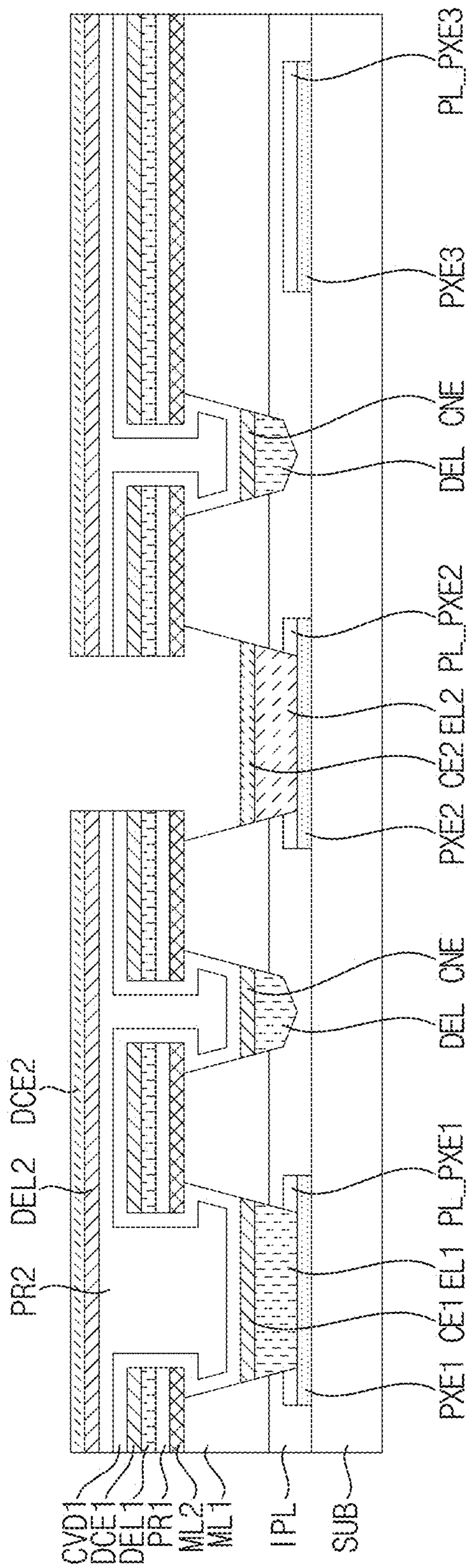

Referring to FIG. 14, after depositing the second organic light emitting material entirely, a transparent conductive material may be deposited entirely.

When the second organic light emitting material is deposited entirely, the second organic light emitting material may be disconnected by the second undercut structure UC2 of the second pixel opening PXO2.

Accordingly, the second organic light emitting layer EL2 disposed in the second pixel opening PXO2 and the second dummy organic light emitting layer DEL2 disposed on the second photosensitive material layer PR2 may be simultaneously formed.

As such, in an embodiment of the invention, a separate mask may not be used in the deposition process of the second organic light emitting material for forming the second organic light emitting layer EL2 in the second pixel opening PXO2. Accordingly, in the case where the area of the second pixel opening PXO2 is relatively small by arranging a relatively large number of pixels PX1, PX2, and PX3 in the display area DA of the display device DD to implement a high resolution, the second organic light emitting layer EL2 may be effectively formed in the second pixel opening PXO2.

When the transparent conductive material is entirely deposited, the transparent conductive material may be disconnected by the second undercut structure UC2 of the second pixel opening PXO2.

Accordingly, by depositing transparent conductive material entirely, the second common electrode layer CE2 disposed in the second pixel opening PXO2 and the second dummy common electrode layer DCE2 disposed on the second dummy organic light emitting layer DEL2 may be simultaneously formed.

As such, in an embodiment of the invention, a separate mask may not be used in the deposition process of the transparent conductive material for forming the second common electrode layer CE2 in the second pixel opening PXO2. Accordingly, in the case where the area of the second pixel opening PXO2 is relatively small by arranging a relatively large number of pixels PX1, PX2, and PX3 in the display area DA of the display device DD to implement a high resolution, the second common electrode layer CE2 may be effectively formed in the second pixel opening PXO2.

Figure 15:
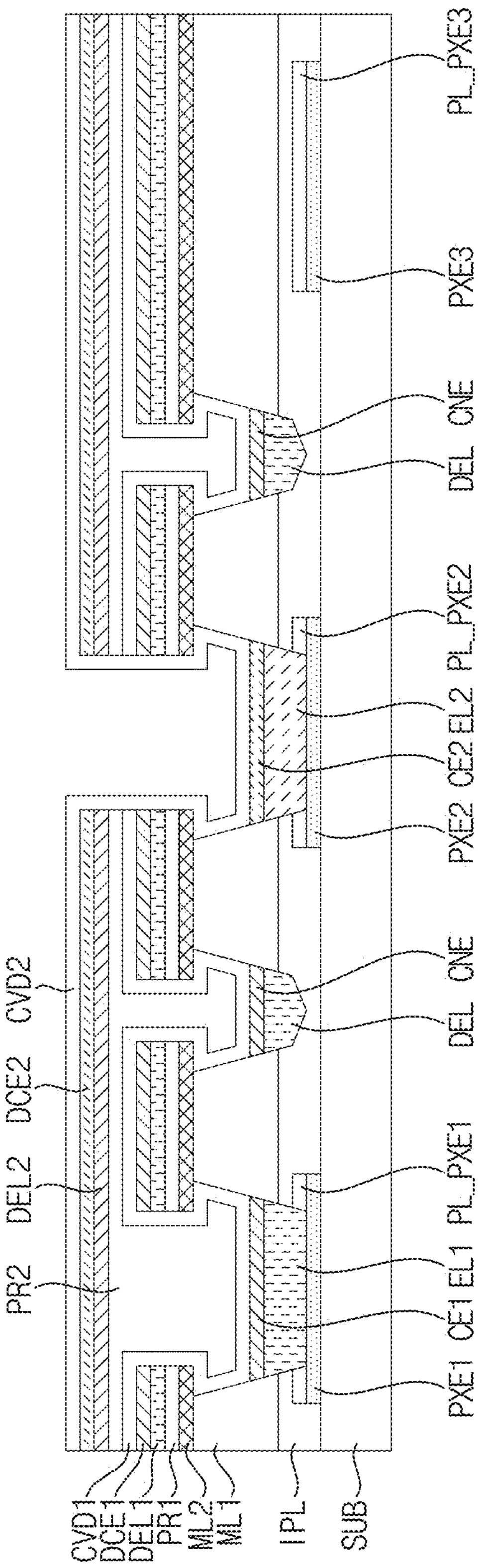

Referring to FIG. 15, the second capping layer CVD2 may be entirely formed. In this case, the second capping layer CVD2 may be formed with a substantially uniform thickness along a cross-sectional profile of components shown in FIG. 14.

A method of forming the second capping layer CVD2 is not particularly limited, and various known methods may be used.

Figure 16:
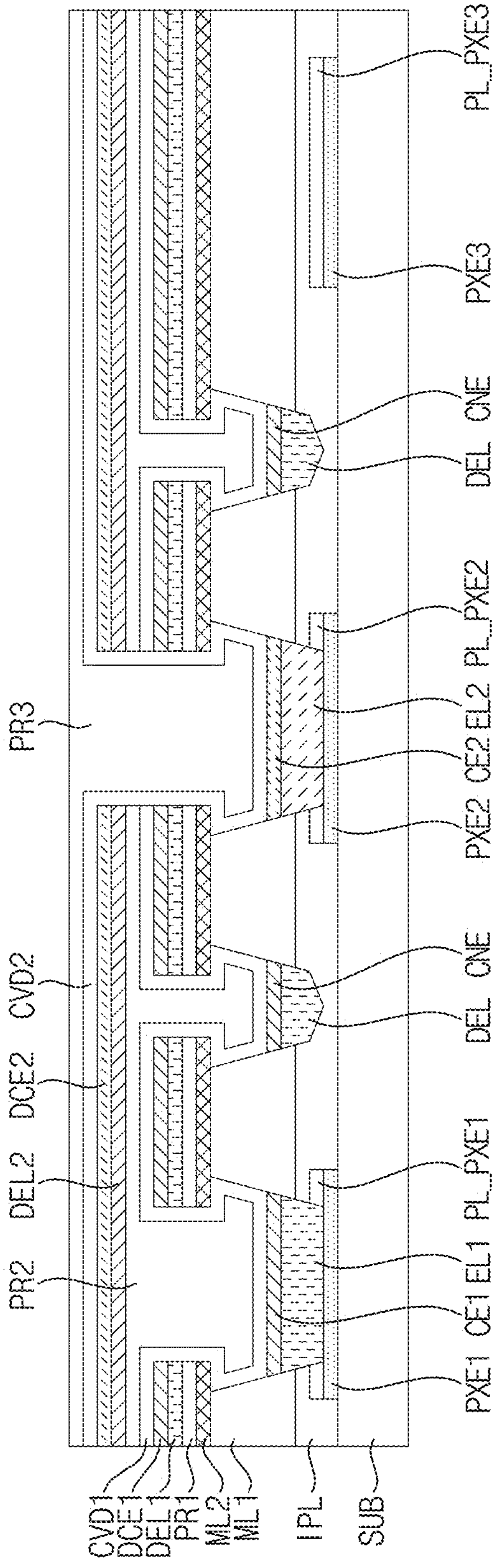

Referring to FIG. 16, the third photosensitive material layer PR3 may be entirely formed. Accordingly, the third photosensitive material layer PR3 may fill the second pixel opening PXO2 covered by the second capping layer CVD2.

Figure 17:
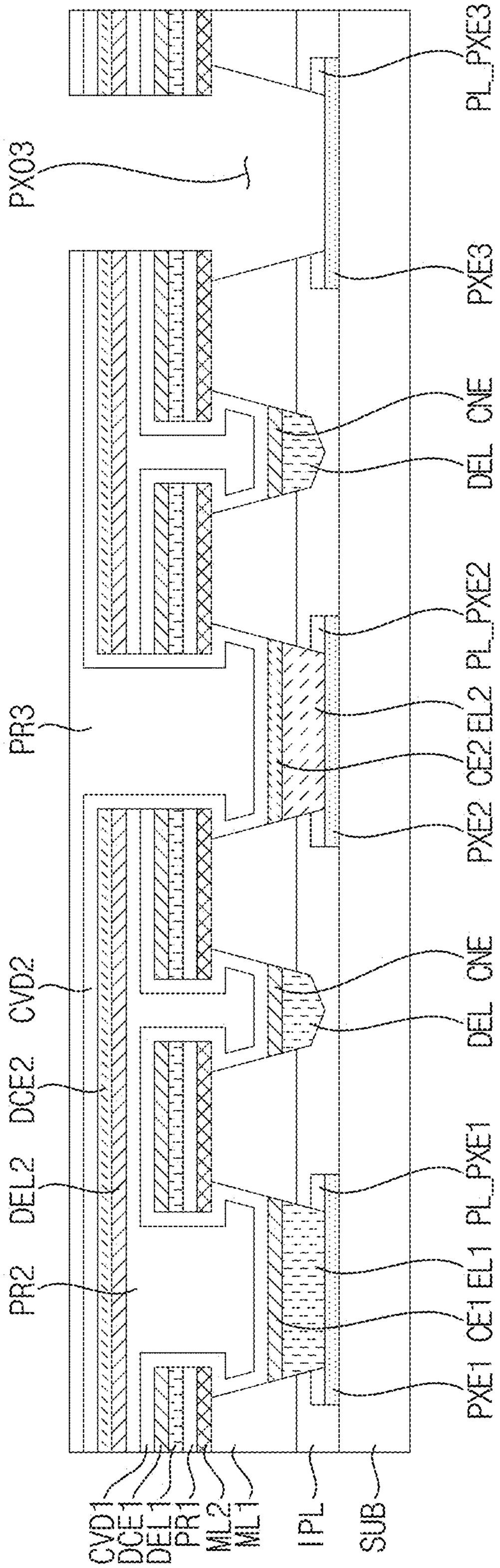

Referring to FIG. 17, a portion of the third photosensitive material layer PR3 may be removed by exposing and developing the third photosensitive material layer PR3. Thereafter, the second capping layer CVD2, the second dummy common electrode layer DCE2, the second dummy organic light emitting layer DEL2, the second photosensitive material layer PR2, the first capping layer CVD1, the first dummy common electrode layer DCE1, the first dummy organic light emitting layer DEL1, the first photosensitive material layer PR1, the second metal layer ML2, the first metal layer ML1, the inorganic protective layer IPL, and the third pixel electrode protective layer PL_PXE3 may be etched using the remaining portions of the third photosensitive material layer PR3 which function as a mask. Accordingly, the third pixel opening PXO3 exposing at least a portion of the third pixel electrode PXE3 may be formed.

More specifically, the second capping layer CVD2, the second dummy common electrode layer DCE2, the second dummy organic light emitting layer DEL2, the second photosensitive material layer PR2, the first capping layer CVD1, the first dummy common electrode layer DCE1, the first dummy organic light emitting layer DEL1, the first photosensitive material layer PR1 may be etched using the third photosensitive material layer PR3 as a mask. In this case, a process for etching the second capping layer CVD2, the second dummy common electrode layer DCE2, the second dummy organic light emitting layer DEL2, the second photosensitive material layer PR2, the first capping layer CVD1, the first dummy common electrode layer DCE1, the first dummy organic light emitting layer DEL1, the first photosensitive material layer PR1 may include one or more etching processes.

Thereafter, the inorganic protective layer IPL, the first metal layer ML1, the second metal layer ML2, and the third pixel electrode protective layer PL_PXE3 may be etched to form the third pixel opening PXO3. A method of forming the third pixel opening PXO3 may be substantially the same as the method of forming the first pixel opening PXO1 described with reference to FIG. 9. Therefore, any repetitive detailed description thereof will be omitted.

Figure 18:
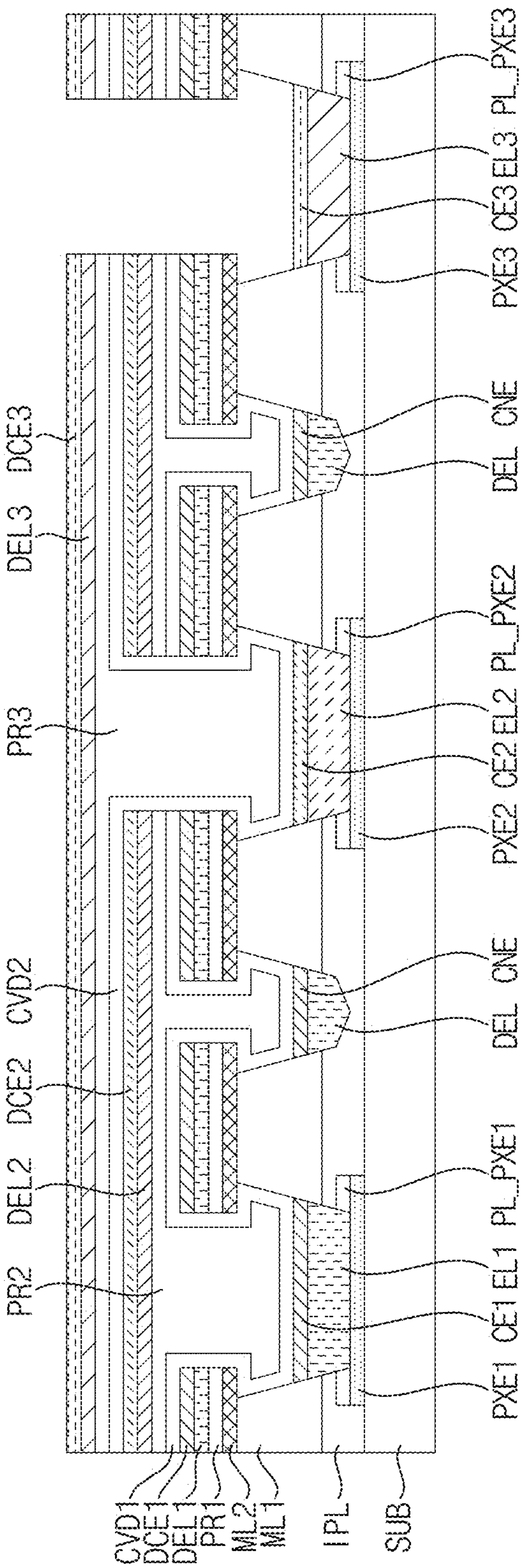

Referring to FIG. 18, after depositing the third organic light emitting material entirely, a transparent conductive material may be deposited entirely.

When the third organic light emitting material is deposited entirely, the third organic light emitting material may be disconnected by the third undercut structure UC3 of the third pixel opening PXO3.

Accordingly, the third organic light emitting layer EL3 disposed in the third pixel opening PXO3 and the third dummy organic light emitting layer DEL3 disposed on the third photosensitive material layer PR3 may be simultaneously formed.

As such, in an embodiment of the invention, a separate mask may not be used in the deposition process of the third organic light emitting material for forming the third organic light emitting layer EL3 in the third pixel opening PXO3. Accordingly, in the case where the area of the third pixel opening PXO3 is relatively small by arranging a relatively large number of pixels PX1, PX2, and PX3 in a display area DA of the display device DD to implement a high resolution, the third organic light emitting layer EL3 may be effectively formed in the third pixel opening PXO3.

When the transparent conductive material is entirely deposited, the transparent conductive material may be disconnected by the third undercut structure UC3 of the third pixel opening PXO3.

Accordingly, by depositing transparent conductive material entirely, the third common electrode layer CE2 disposed in the third pixel opening PXO3 and the third dummy common electrode layer DCE3 disposed on the third dummy organic light emitting layer DEL3 may be simultaneously formed.

As such, in an embodiment of the invention, a separate mask may not be used in the deposition process of the transparent conductive material for forming the third common electrode layer CE3 in the third pixel opening PXO3. Accordingly, in the case where the area of the third pixel opening PXO3 is relatively small by arranging a relatively large number of pixels PX1, PX2, and PX3 in a display area DA of the display device DD to implement a high resolution, the third common electrode layer CE3 may be effectively formed in the third pixel opening PXO3.

Figure 19:
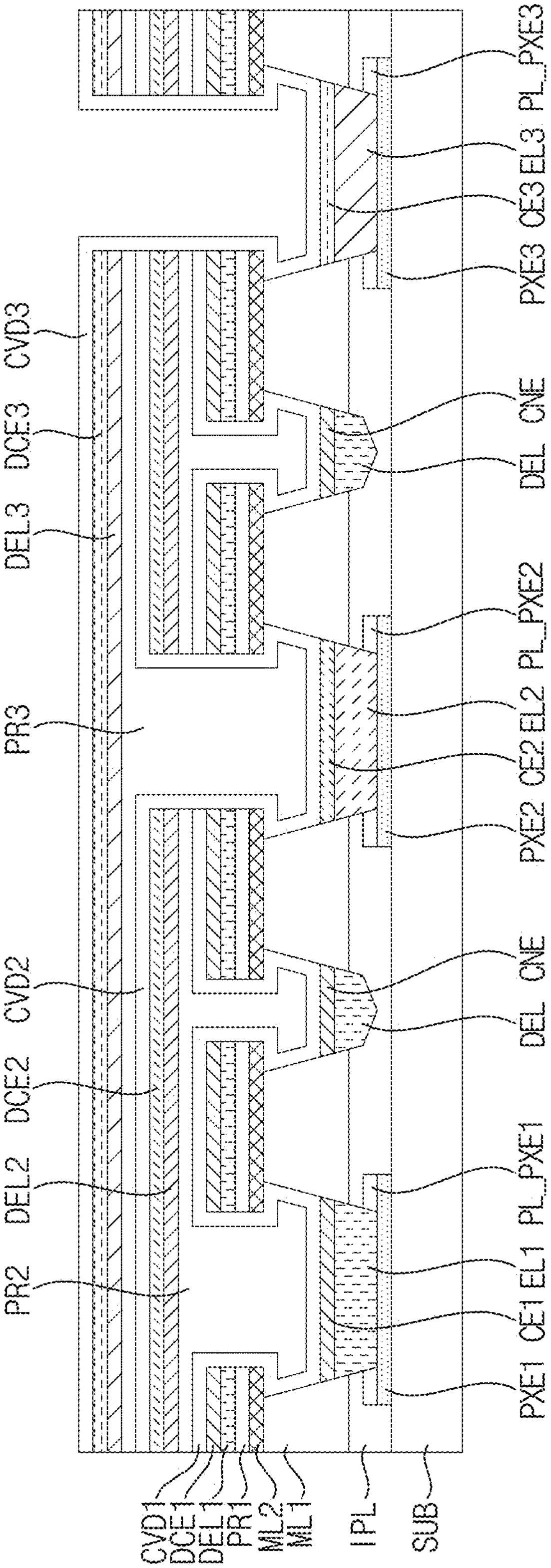

Referring to FIG. 19, the third capping layer CVD3 may be entirely formed. In this case, the third capping layer CVD3 may be formed with a substantially uniform thickness along a cross-sectional profile of components shown in FIG. 18.

A method of forming the third capping layer CVD3 is not particularly limited, and various known methods may be used.

Figure 20:
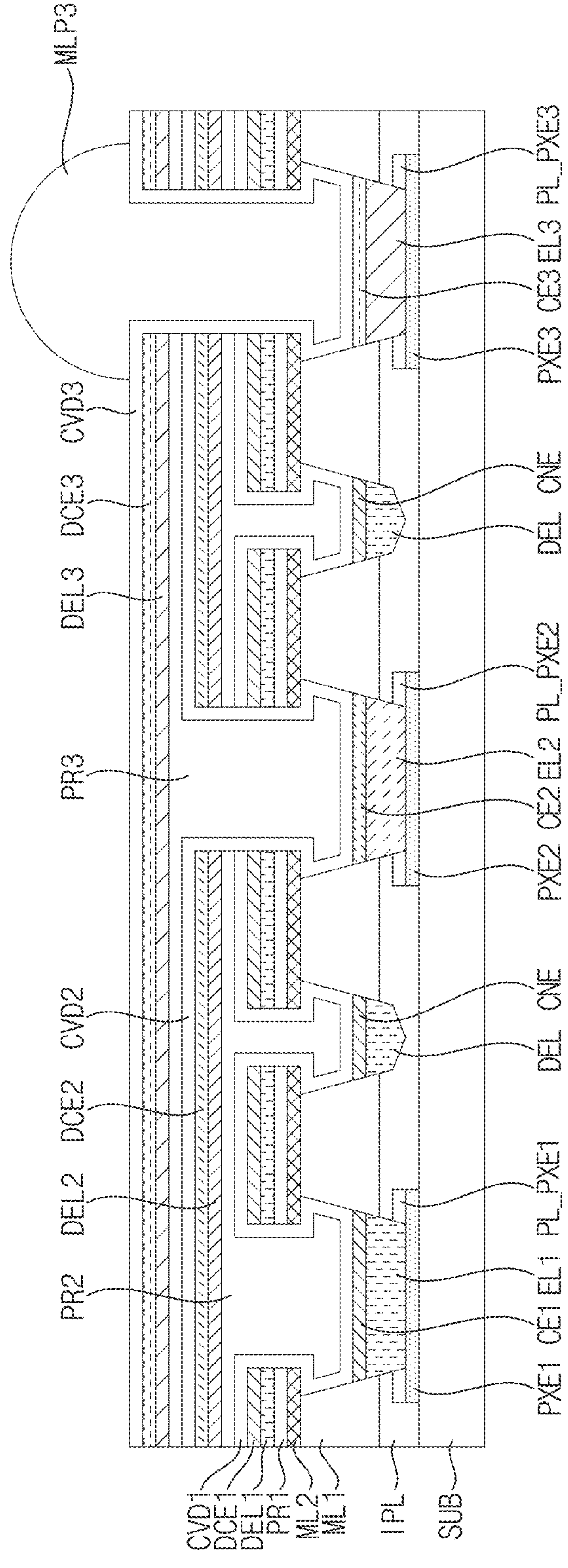

Referring to FIG. 20, the third light extraction structure MLP3 may be formed. The third light extraction structure MLP3 may be formed to fill the third pixel opening PXO3 covered by the third capping layer CVD3. The third light extraction structure MLP3 may have a convex upper surface over the third pixel opening PXO3.

Figure 21:
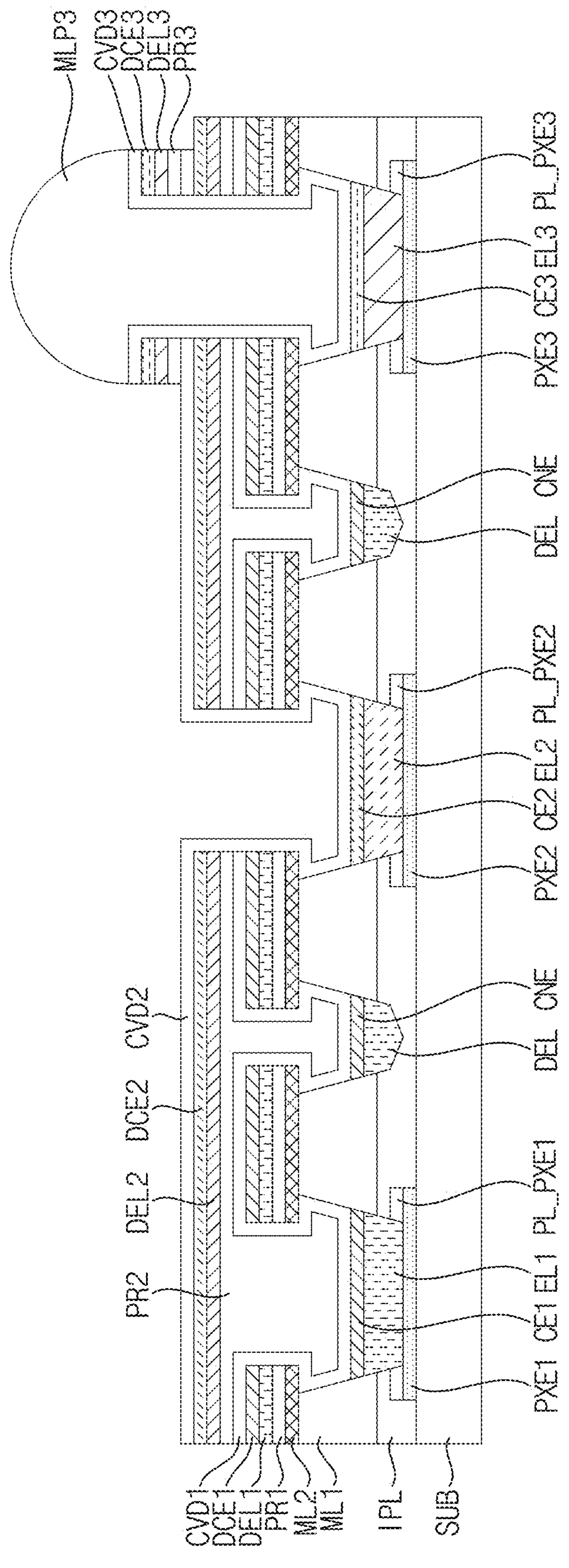

Referring to FIG. 21, the third capping layer CVD3, the third dummy common electrode layer DCE3, the third dummy organic light emitting layer DEL3, and the third photosensitive material layer PR3 may be etched using the third light extraction structure MLP3 as a mask. Accordingly, the third pixel PX3 described with reference to FIG. 2 may be formed.

Figure 22:
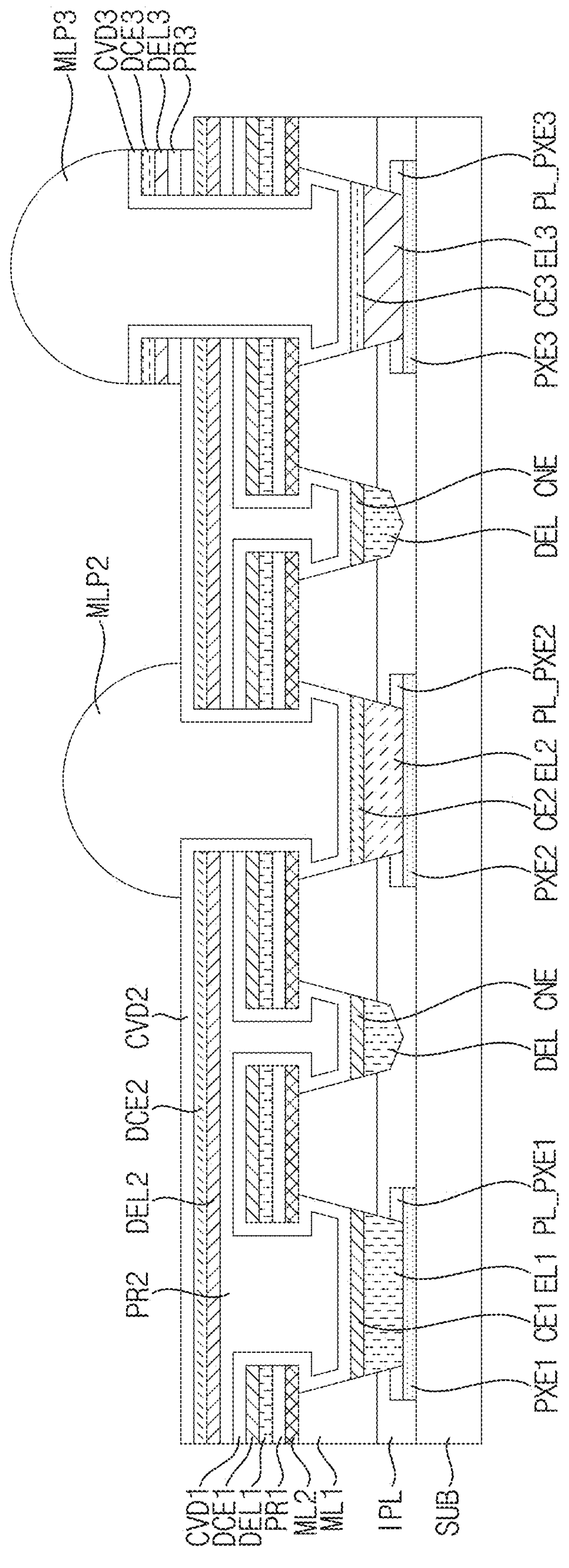

Referring to FIG. 22, the second light extraction structure MLP3 may be formed. The second light extraction structure MLP3 may be formed to fill the second pixel opening PXO2 covered by the second capping layer CVD2. The second light extraction structure MLP2 may have a convex upper surface over the second pixel opening PXO2.

Figure 23:
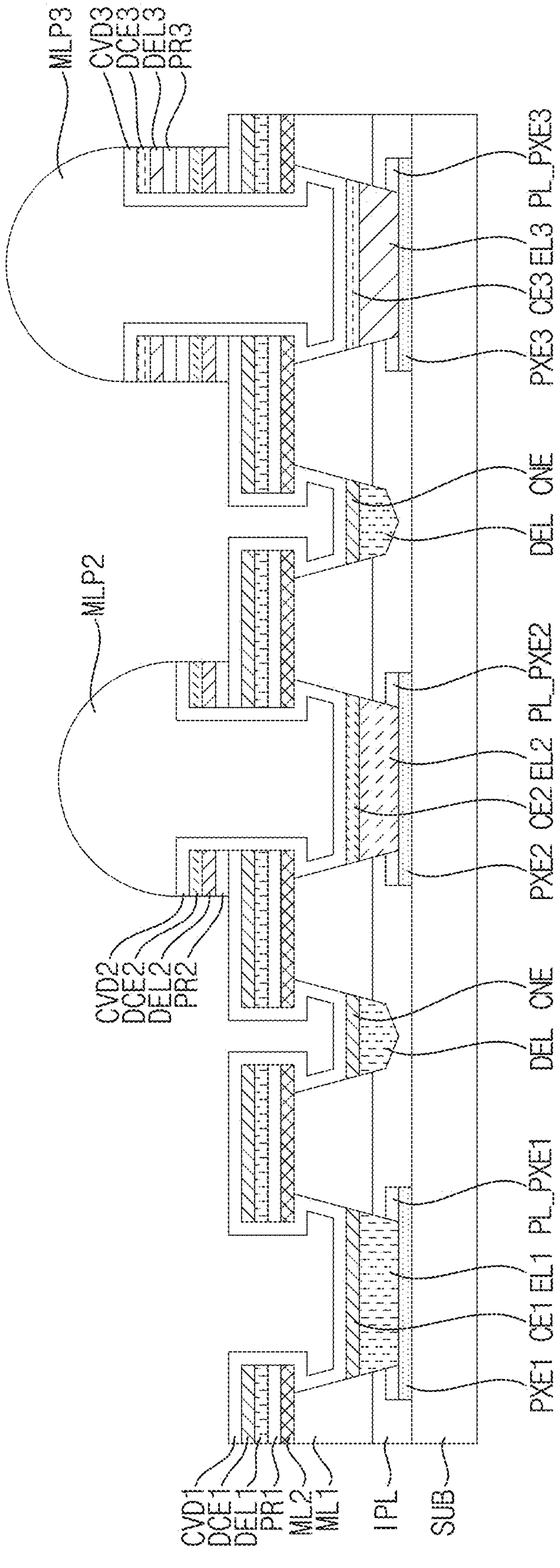

Referring to FIG. 23, the second capping layer CVD2, the second dummy common electrode layer DCE2, the second dummy organic light emitting layer DEL2, and the second photosensitive material layer PR2 may be etched using the second light extraction structure MLP2 and the third light extraction structure MLP3 as a mask. Accordingly, the second pixel PX2 described with reference to FIG. 2 may be formed.

Figure 24:
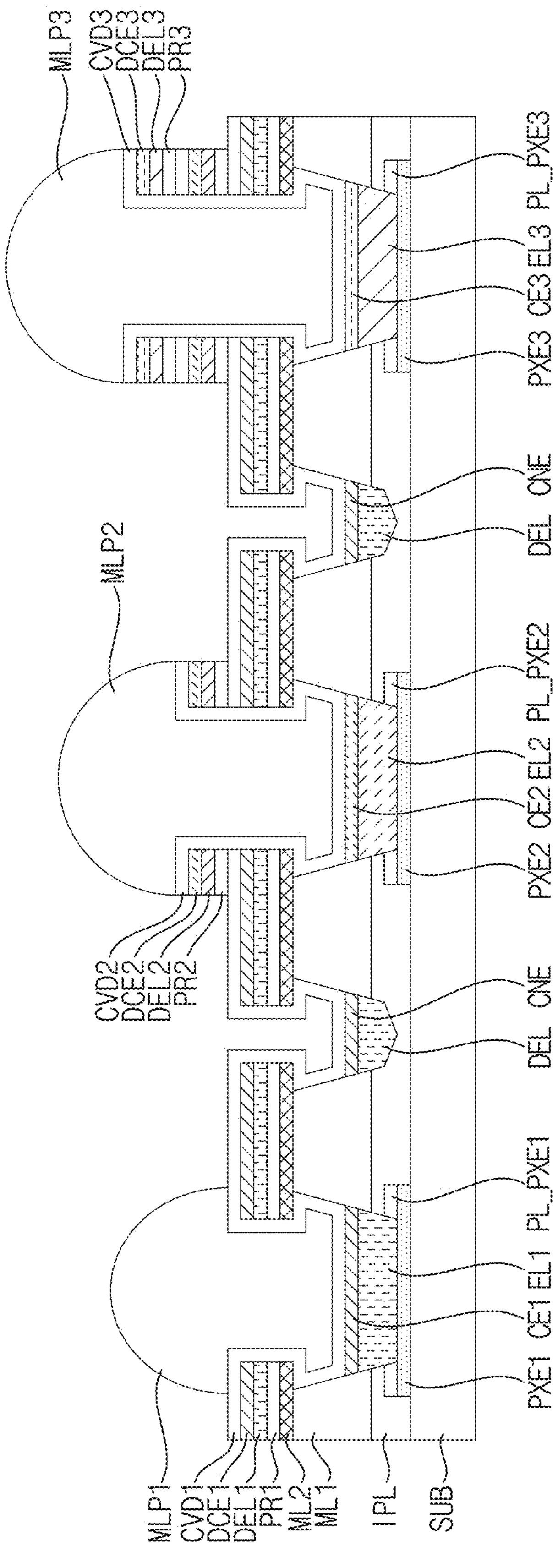

Referring to FIG. 24, the first light extraction structure MLP1 may be formed. The first light extraction structure MLP1 may be formed to fill the first pixel opening PXO1 covered by the first capping layer CVD1. The first light extraction structure MLP1 may have a convex upper surface over the third pixel opening PXO1. Accordingly, the first pixel PX1 described with reference to FIG. 2 may be formed.

Figure 25:
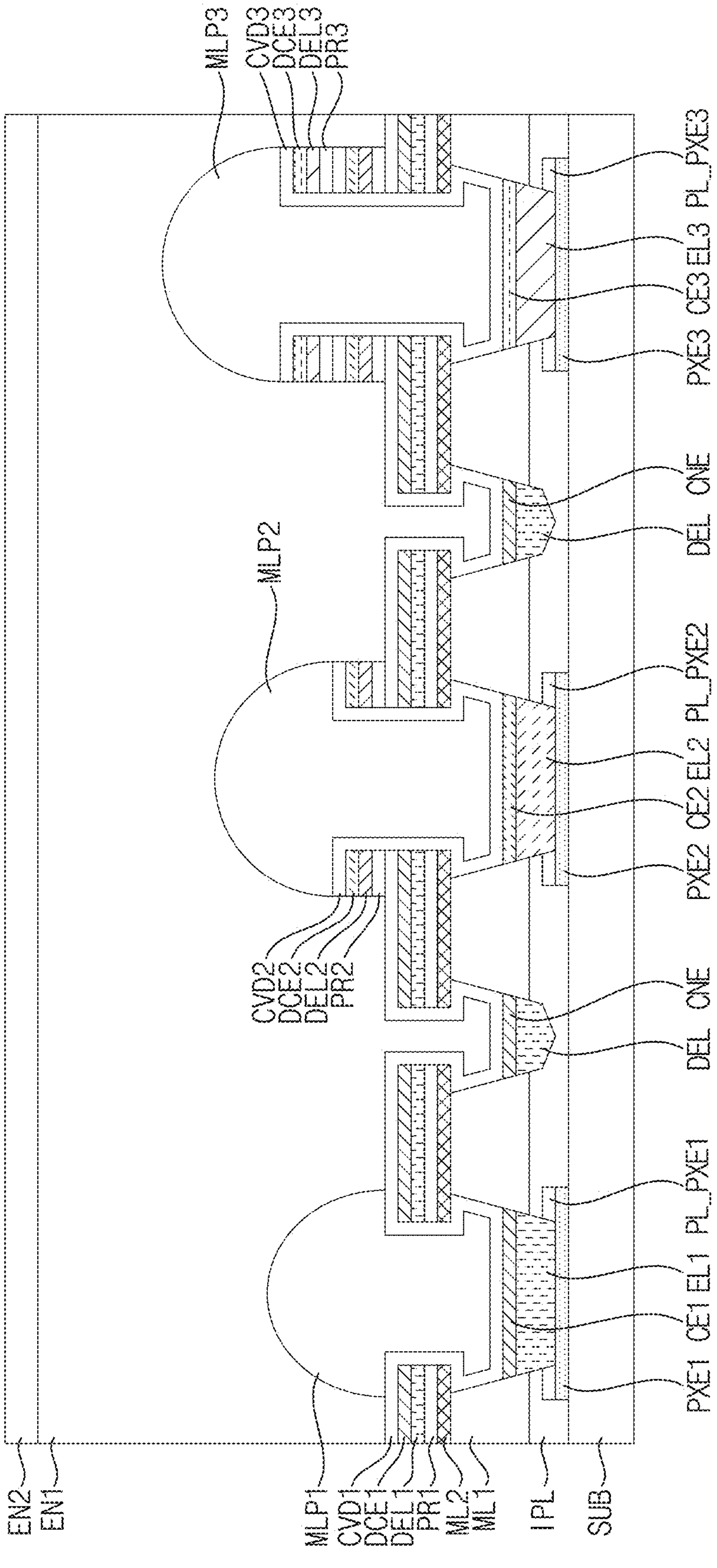

Referring to FIG. 25, the organic encapsulation layer EN1 may be entirely formed to cover the first pixel PX1, the second pixel PX2, and the third pixel PX3. In this case, the organic encapsulation layer EN1 may be formed to fill the first groove GR1 and the second groove GR2. Accordingly, the organic encapsulation layer EN1 may not be peeled off due to an external impact or the like.

Thereafter, the inorganic encapsulation layer EN2 may be formed on the organic encapsulation layer EN1.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A method of manufacturing a display device, the method comprising:
- forming a first pixel electrode, a second pixel electrode and a third pixel electrode, which are spaced apart from each other, on a substrate;
- forming an inorganic protective layer covering the first pixel electrode, the second pixel electrode, and the third pixel electrode entirely over the substrate;
- forming a first metal layer entirely on the inorganic protective layer;
- forming a second metal layer entirely over the first metal layer;
- forming a first photosensitive material layer entirely on the second metal layer;
- exposing and developing a portion of the first photosensitive material layer;
- forming a first pixel opening exposing a portion of the first pixel electrode through the first metal layer and the second metal layer using the first photosensitive material layer as a mask;
- forming a first organic light emitting material entirely on the substrate;
- forming a first conductive material entirely over the substrate;
- forming a first capping layer entirely over the substrate; and
- forming a first light extraction structure filling the first pixel opening and having a convex upper surface over the first pixel opening.

2. The method of claim 1, wherein the forming the first pixel opening includes:
- dry etching the second metal layer, the first metal layer, and the inorganic protective layer using the first photosensitive material layer as a mask; and
- wet etching the first metal layer.

3. The method of claim 1, further comprising:
- forming a first groove positioned between the first pixel electrode and the second pixel electrode and a second groove positioned between the second pixel electrode and the third pixel electrode using the first photosensitive material layer as a mask.

4. The method of claim 1, further comprising:
- after the forming the first capping layer entirely, forming a second photosensitive material layer entirely on the first capping layer;
- exposing and developing a portion of the second photosensitive material layer;
- forming a second pixel opening exposing a portion of the second pixel electrode through the first metal layer and the second metal layer using the second photosensitive material layer as a mask;
- forming a second organic light emitting material entirely on the substrate;
- forming a second conductive material entirely over the substrate;
- forming a second capping layer entirely over the substrate;
- forming a third photosensitive material layer entirely on the second capping layer;
- exposing and developing a portion of the third photosensitive material layer;
- forming a third pixel opening exposing a portion of the third pixel electrode through the first metal layer and the second metal layer using the third photosensitive material layer as a mask;
- forming a third organic light emitting material entirely on the substrate;
- forming a third conductive material entirely over the substrate; and
- forming a third capping layer entirely over the substrate.

5. The method of claim 4, further comprising:
- after the forming the third capping layer entirely, forming a third light extraction structure filling the third pixel opening and having a convex upper surface over the third pixel opening; and
- etching a portion of the third capping layer, a portion of the third conductive material, a portion of the third organic light emitting material, and a portion of the third photosensitive material layer using the third light extraction structure as a mask.

6. The method of claim 4, further comprising:
- after the etching the portion of the third capping layer, the portion of the third conductive material, the portion of the third organic light emitting material, and the portion of the third photosensitive material layer, forming a second light extraction structure filling the second pixel opening and having a convex upper surface over the second pixel opening; and
- etching a portion of the second capping layer, a portion of the second conductive material, a portion of the second organic light emitting material, and a portion of the second photosensitive material layer using the second light extraction structure as a mask.

7. The method of claim 1, further comprising:

after the forming the first light extracting structure, forming an organic encapsulation layer entirely on the substrate; and forming an inorganic encapsulation layer entirely on the organic encapsulation layer.

* * * * *